(12) United States Patent
Kurotani et al.

(10) Patent No.: US 7,078,765 B2
(45) Date of Patent: Jul. 18, 2006

(54) SEMICONDUCTOR DEVICE AND A METHOD OF MANUFACTURING THE SAME

(75) Inventors: Kingo Kurotani, Takasaki (JP); Takeshi Sakamoto, Takasaki (JP); Michio Yano, Maebashi (JP); Kenichi Nagura, Moroyama (JP)

(73) Assignee: Renesas Technology Corp., Tokyo (JP)

( * ) Notice: Subject to any disclaimer, the term of this patent is extended or adjusted under 35 U.S.C. 154(b) by 29 days.

(21) Appl. No.: 10/812,870

(22) Filed: Mar. 31, 2004

(65) Prior Publication Data

US 2004/0188805 A1    Sep. 30, 2004

(30) Foreign Application Priority Data

Mar. 31, 2003 (JP) ............................. 2003-093783

(51) Int. Cl.
*H01L 29/94* (2006.01)
(52) U.S. Cl. ...................... 257/341; 257/342; 257/401; 257/620
(58) Field of Classification Search ..................... None
See application file for complete search history.

(56) References Cited

U.S. PATENT DOCUMENTS 6,372,557 B1 *   4/2002   Leong .......................... 438/142
2002/0167047 A1 * 11/2002  Yasuhara et al. ........... 257/341

FOREIGN PATENT DOCUMENTS

JP       05-218321       8/1993
JP       2002-176142     6/2002

* cited by examiner

*Primary Examiner*—Tu-Tu Ho
(74) *Attorney, Agent, or Firm*—Antonelli, Terry, Stout and Kraus, LLP.

(57) ABSTRACT

In a technique to improve the high-frequency power gain of an LDMOS, the distance from the surface of a passivation film covering electrode pads to the rear surface of a silicon substrate is set into 200 μm or less, or a trench of 2 μm or more in thickness, in which an insulating film or a conductor is embedded, is formed between a region where a p type impurity is diffused, when a $p^+$ type source penetrating layer is formed, and the channel region of a third LDMOS, so as to extend from the front surface of a semiconductor layer toward a silicon substrate. This trench restrains the $p^+$ type source penetrating layer from spreading to the channel region, thereby lowering the inductance or the resistance of the source and improving the high-frequency power gain.

4 Claims, 24 Drawing Sheets

: INEFFECTIVE SHOTS

9 : p TYPE SOURCE PENETRATING LAYERS
36 : TRENCHES

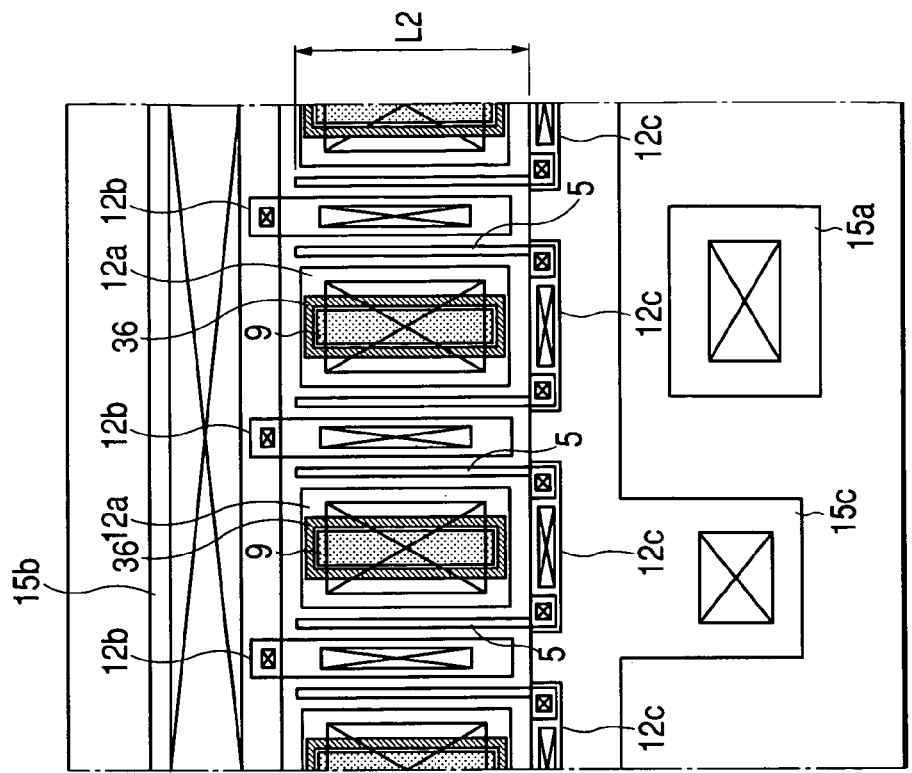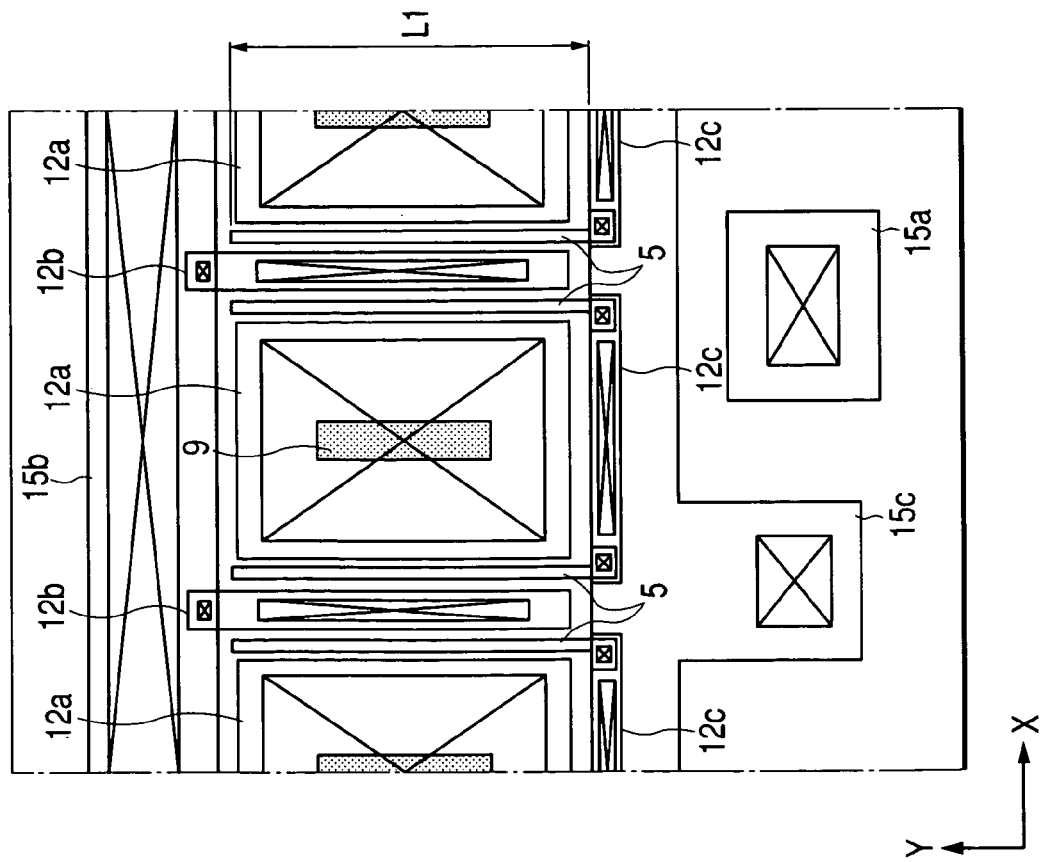

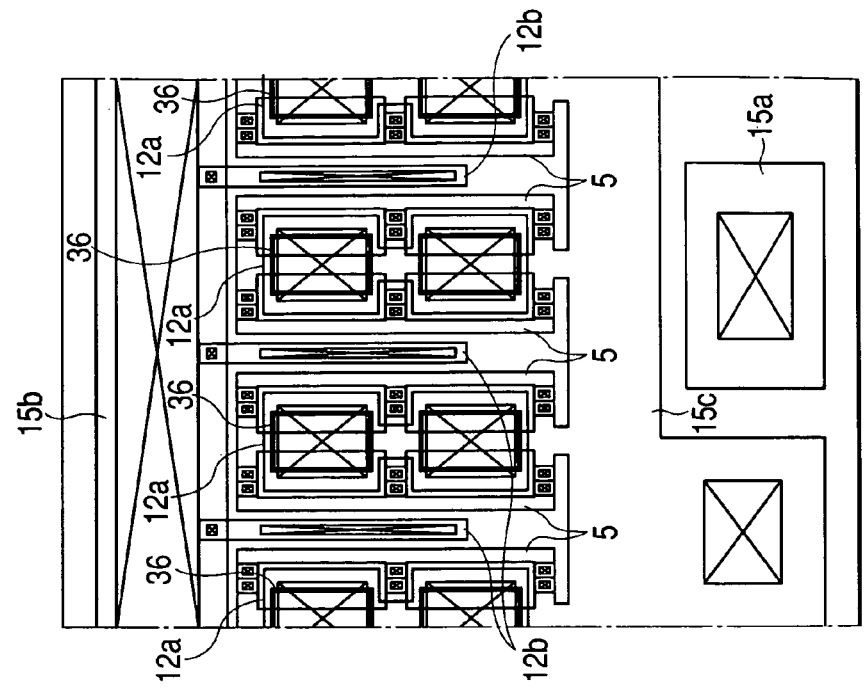
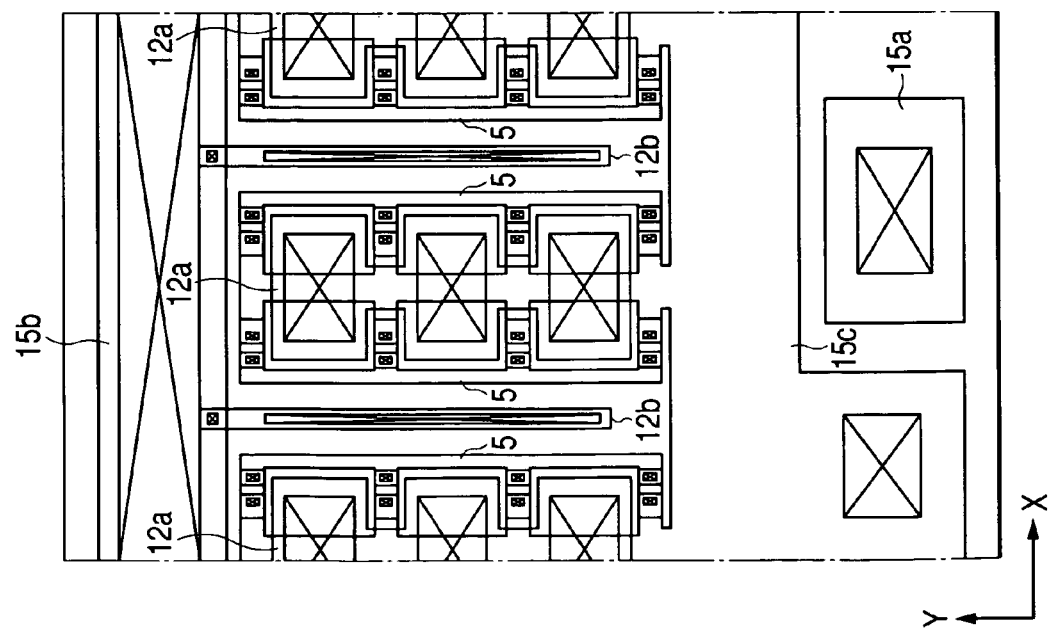

SEMICONDUCTOR DEVICE AND A METHOD OF MANUFACTURING THE SAME

CROSS-REFERENCE TO RELATED APPLICATION

The present invention claims priority from Japanese patent application JP 2003-093783, filed on Mar. 31, 2003, the content of which is hereby incorporated by reference into this application.

BACKGROUND OF THE INVENTION

The present invention relates to a semiconductor device and to a technique for manufacturing the same; and, in particular, the invention relates to a semiconductor device having laterally diffused metal oxide semiconductor field effect transistors (LDMOS•FETs) and to a method of manufacturing the same.

In recent years, LDMOS•FETs (hereinafter referred to merely as LDMOSes) have been used to amplify high-frequency electric power for portable telephone base stations or digital television station transmitters, instead of bipolar transistors, since the LDMOSes produce various advantages, such as simplification of the bias circuits or the provision of high power gain.

An LDMOS is formed in a p-epitaxial layer grown on a $p^+$ substrate, and it is composed of a gate, an $n^+$ source region reaching the bottom of one end of the gate, an $n^-$ drain region reaching the bottom of the other end of the gate, an $n^+$ drain region spaced from the latter gate end by the length of the $n^-$ drain region, and a p well wherein a channel region is formed.

Although the $n^+$ source region and the $n^+$ drain region of the LDMOS are positioned on the front surface of the chip, a source electrode is formed in the $p^+$ substrate in the rear surface of the chip. Therefore, the $n^+$ source region is connected to the $p^+$ substrate in the rear surface of the chip through a low-resistance $p^+$ source penetrating layer that is diffused in the horizontal direction or a conductor (see, for example, Patent Document 1). The connection of the $n^+$ source region to the $p^+$ substrate through the low-resistance $p^+$ source penetrating layer or the conductor causes a reduction in the inductance or the resistance of the $n^+$ source region so as to prevent the high-frequency power gain of the LDMOS from being lowered.

[Patent Document 1]

Japanese Patent Application Laid-Open No. Hei 5(1993)-218321

In order to obtain a higher gain in the LDMOS, it is necessary that the inductance or the resistance of the $n^+$ source region is made low by at least one of the following methods: (1) the thickness of the $p^+$ substrate is made small; (2) the plane area of the $p^+$ source penetrating layer is enlarged; and (3) the concentration of the $p^+$ source penetrating layer is made high. However, the inventors have found that these methods (1) to (3) have the following problems.

SUMMARY OF THE INVENTION

First, in the method (1) wherein the thickness of the $p^+$ substrate is made small, the warp of the $p^+$ substrate becomes larger as the thickness of the $p^+$ substrate is made smaller. Thus, there is a problem in that the wafer (flat substantially-circular substrate wherein plural chips having formed LDMOSes are arranged) is not easily handled. In particular, in a probe inspection step for inspecting each of the chips formed on the wafer to determine if they are good or bad, after the thickness from the surface of a passivation film covering the LDMOSes to the rear surface of the $p^+$ substrate is set to 200 μm or less by polishing the rear surface of the $p^+$ substrate, the manufacturing yield of the chips is lowered due to breakage of the wafer. In other words, in this probe inspection, which comprises the operations of putting the wafer onto a measuring stage, vacuum-adsorbing the wafer, shifting the wafer in the state that the wafer is put on the measuring stage, bringing probes into contact with gate electrode pads and drain electrode pads on the front surface side of the chips, and measuring the characteristics of the LDMOSes, a strong force is applied to the wafer at the time of vacuum-adsorbing or shifting the wafer, so that the wafer is easily broken.

Thus, the inventors have made an investigation of the possible application of a reinforcing tape onto the rear surface of the wafer as a measure against wafer breakage in the above-mentioned probe inspection step. Conventionally, the $n^+$ source region of an LDMOS is connected to a $p^+$ substrate through a $p^+$ source penetrating layer or a conductor, and the $p^+$ substrate is used a source electrode, as described above. It is therefore necessary to form a source electrode pad for probe inspection on the front surface of the wafer to be used in the probe inspection, wherein a tape is adhered to the rear surface of the wafer.

However, when the source electrode pad is formed on the front surface of the wafer, the source electrode pad has a parasitic capacitance between this pad and the gate electrode pad. It is therefore difficult to measure the high-frequency characteristic of the LDMOS precisely. The inventors have also made an investigation of the possibility of decreasing the parasitic capacitance by detaching the source electrode pad formed on the front surface of the wafer from the gate electrode pad by forming the source electrode pad in scribing areas arranged in the four surrounding sides of each chip. However, in the scribing areas, a TEG pattern, an alignment pattern, a size pattern and other patterns are usually formed. Moreover, in a lithographic technique using a scaling-down projection method, targets for alignment are positioned in the four corners in the outermost circumference of a shot in order to make the alignment accuracy high. It is therefore impossible that a scribing area, wherein the source electrode pad can be formed, is supplied to each of the chips.

Secondly, the method (2) of enlarging the plane area of the $p^+$ source penetrating layer has a problem in that the $p^+$ source penetrating layer reaches the channel region of the LDMOS so as to make the on-resistance or threshold value thereof large, so that desired static characteristics of the LDMOS cannot be obtained. In order that the $p^+$ source penetrating layer cannot reach the channel region of the LDMOS, the diffusion starting position of a p type impurity can be detached from the channel region when the $p^+$ source penetrating layer is formed. However, it is essential to set the depth of the $p^+$ source penetrating layer to a larger value than the thickness of the p epitaxial layer and cause the $p^+$ source penetrating layer to reach the wafer, so as to prevent low-resistance components in the p epitaxial layer from entering the $n^+$ source region. It is therefore necessary to set the distance from the diffusion starting position of the p type impurity from the end of the gate to a larger value than the depth of the $p^+$ source penetrating layer. Consequently, the pitch of the unit LDMOSes becomes large. Thus, in order to ensure an appropriate drain current, it is necessary to make the gate finger length larger. As a result, the resistance of the gate or the drain interconnection electrode increases, and the parasitic inductance or parasitic capacitance increases so as to deteriorate the high-frequency characteristic of the LDMOSes.

Thirdly, in the method (3) of making the concentration of the p+ source penetrating layer high, it is necessary that, when the p+ source penetrating layer is formed, the diffusion starting position of a p type impurity is detached from the channel region in the same manner as in the method (2). Thus, the high-frequency characteristic of the LDMOSes is deteriorated.

An object of the present invention is to provide a technique which makes it possible to improve the high-frequency power gain of an LDMOS.

Another object of the present invention is to provide a technique which makes it possible to shrink chips in size so as to improve the yield of LDMOSes.

The above-mentioned objects, other objects and new characteristics of the present invention will be made apparent by way of the following description and the attached drawings.

A summary of typical embodiments of the invention disclosed in the present application, is as follows.

A first embodiment of the present invention is represented by a laterally diffused field effect transistor which comprises, on a p type silicon substrate, an element-forming area and a scribing area surrounding the element-forming area; and, it comprises a p type semiconductor layer formed in the element-forming area on the silicon substrate, a gate insulating film formed on the semiconductor layer, a gate electrode formed on the gate insulating film, a source comprised of an n+ semiconductor region, a drain composed of an n− semiconductor region which has a first impurity concentration, and an n+ semiconductor region which has a higher second impurity concentration than the first impurity concentration and is formed at a position farther from the gate electrode than the n− semiconductor region, a p type well wherein a channel region is formed, and an electrode which is electrically connected to the source and is formed on the rear surface of the silicon substrate, wherein a source electrode pad, to be used for evaluation, is formed in the element-forming area in the front surface side of the silicon substrate and is electrically connected to the silicon substrate.

A second embodiment of the present invention is represented by a laterally diffused field effect transistor which comprises a p type semiconductor layer on a p+ type silicon substrate, a gate insulating film formed on the semiconductor layer, a gate electrode formed on the gate insulating film, a source comprised of an n+ semiconductor region, a drain composed of an n− semiconductor region which has a first impurity concentration, and an n+ semiconductor region which has a higher second impurity concentration than the first impurity concentration and is formed at a position farther from the gate electrode than the n− semiconductor region, a p type well wherein a channel region is formed, and a p+ type source penetrating layer, formed in the semiconductor layer, for connecting the n+ type semiconductor region, which constitutes the source, and the silicon substrate electrically to each other, wherein a trench is formed between the n+ type semiconductor region, which constitutes the source, and the p+ type source penetrating layer, so as to extend from the front surface of the semiconductor layer toward the silicon substrate.

BRIEF DESCRIPTION OF THE DRAWINGS

FIG. 14(a) is a partial layout diagram of LDMOSes wherein no trenches are made, and FIG. 14(b) is a partial layout diagram of LDMOSes wherein trenches are made.

FIG. 15(a) is a partial layout diagram opf LDMOSes wherein no trenches are made, the LDMOSes being arranged into multipie rows, and FIG. 15(b) is a partial layout diagram of LDMOSes wherein trenches are made, the LDMOSes being arranged into multiple rows.

DETAILED DESCRIPTION OF THE PREFERRED EMBODIMENTS

Embodiments of the present invention will be described in detail hereinafter. The same reference numbers are attached to members having the same function in all of the drawings, and a repeated description of members having the same function will be omitted.

If necessary for sake of convenience, the embodiments may be described as being divided into plural sections or forms. However, it should be understood that such sections or forms are related to each other, and one thereof is a modified example, a detailed description, a supplementary description or the like of the other or others unless otherwise described.

When a numerical value (for example, a number of elements, quantity, or the upper or lower limit of a range) is specifically referred to in the following description of embodiments, the specific numerical value is not restrictive and a numerical value over or below the specific numerical value may be applied, except in the case where it is stated that the specific numerical value is restrictive, or in the case where the numerical value is clearly restrictive from the viewpoint of an applied principle.

In the following embodiments, a constituent (for example, an element, or a step) thereof is not essential except in the case where it is stated that the constituent is essential, or in the case where the constituent is clearly essential from the viewpoint of an applied principle.

Similarly, when the shape, the positional relationship, or some other factor of one or more constituents or the like is referred to in the following description of the embodiments, analogs of the shape or the like may be used except in the case where it is stated that other shapes or the like cannot be used, or in the case where it is clear that other shapes or the like cannot be used from the viewpoint of an applied principle. This is also true concerning the above-mentioned numerical value.

Embodiment 1

Figure 1:
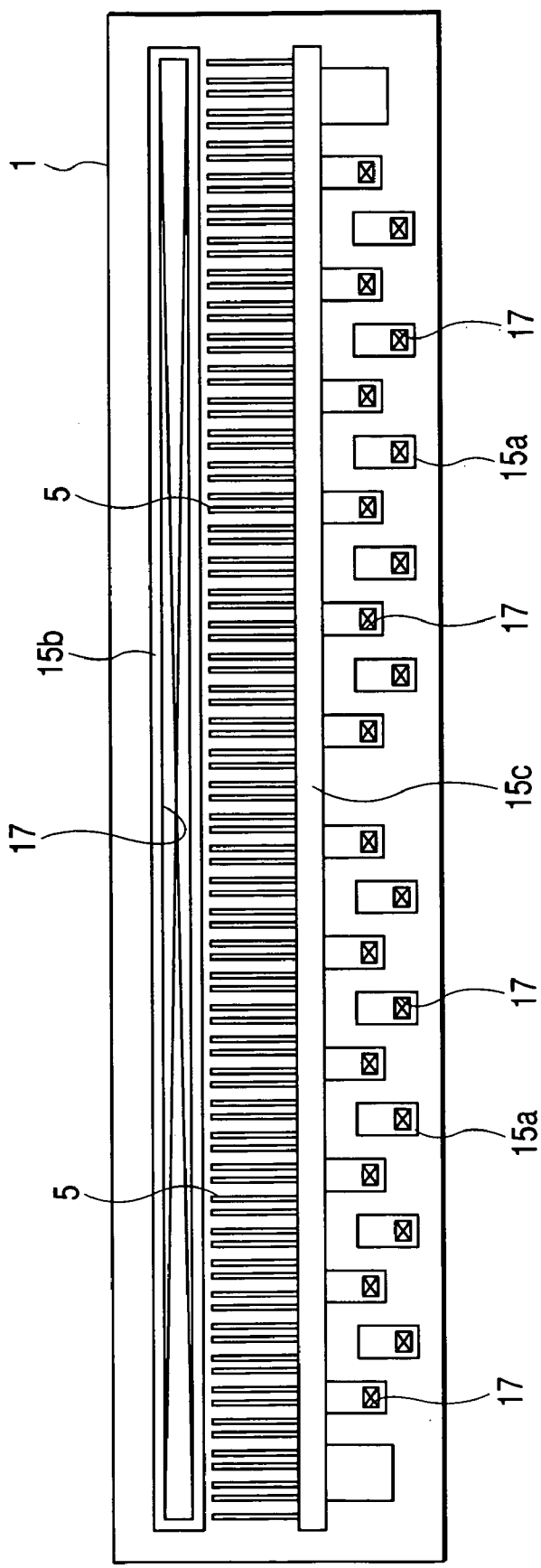
FIG. 1 is a partial layout diagram of a semiconductor substrate and illustrates an example of one high-frequency power transistor, formed on one chip, according to embodiment 1.
Figure 2:
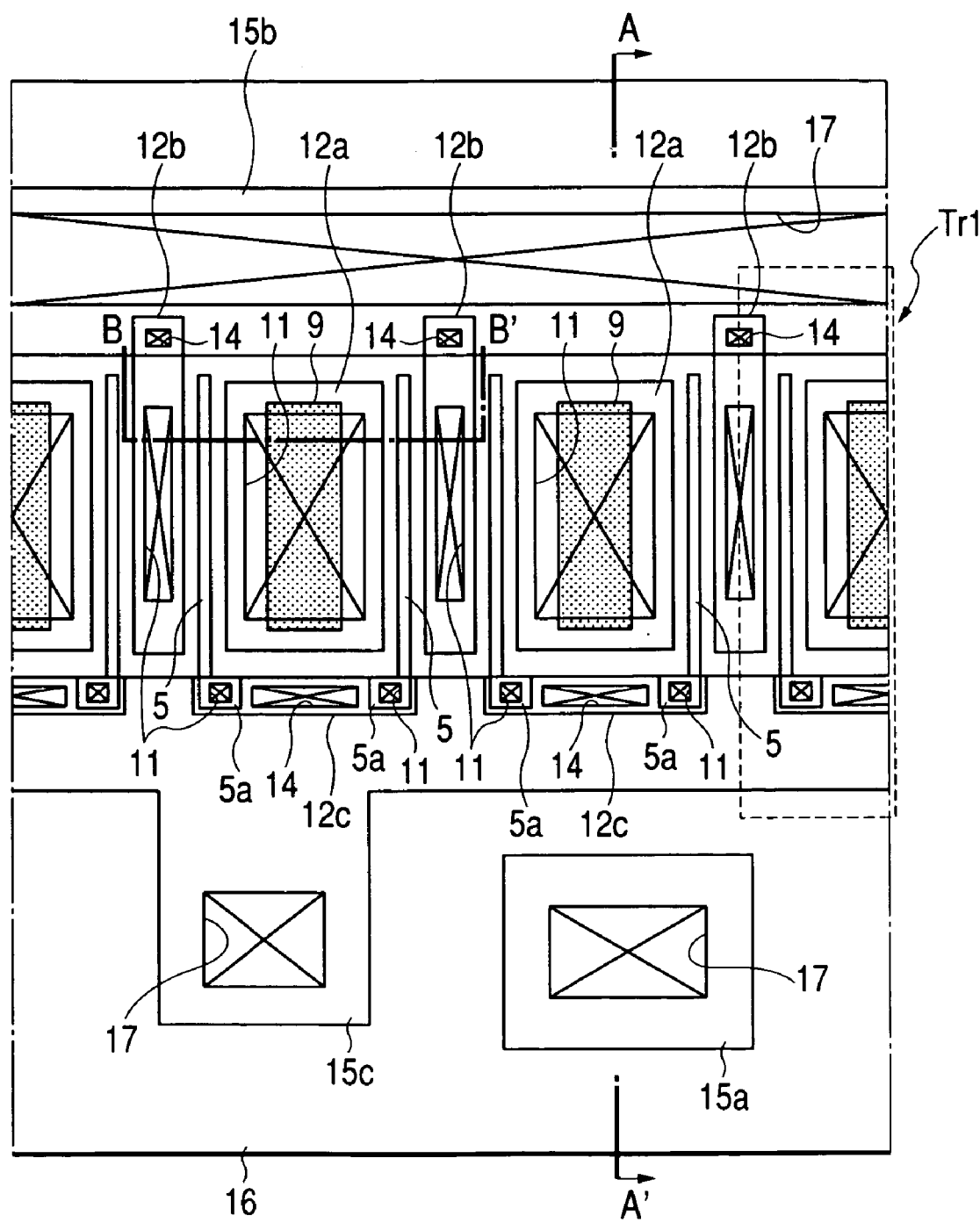
FIG. 2 is a partial layout diagram of the semiconductor substrate wherein some of the LDMOSes illustrated in FIG. 1 are illustrated so as to be enlarged.
Figure 3:
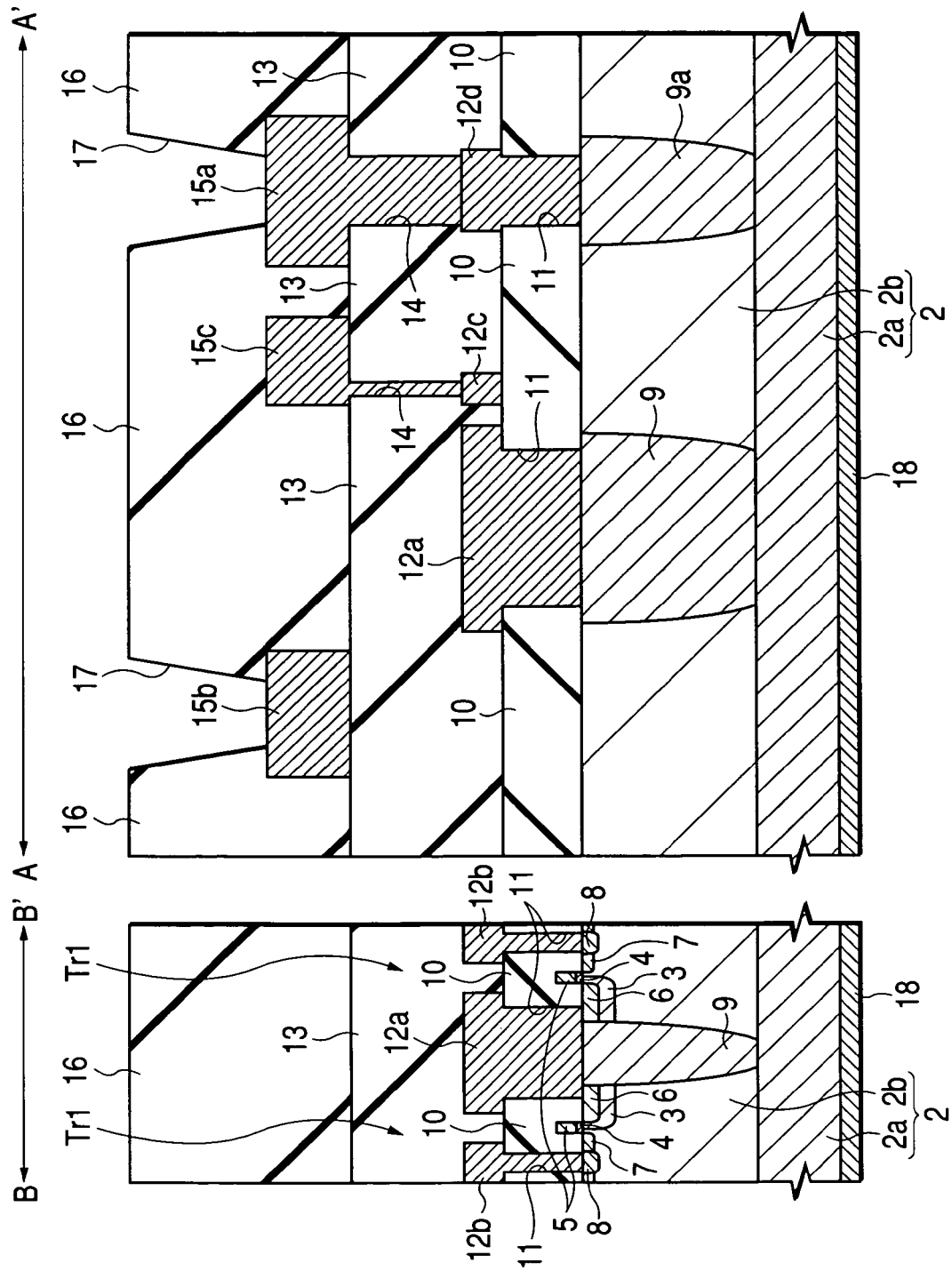
FIG. 3 is a partial sectional view of the semiconductor substrate, taken on a line A–A' and a line B–B' in FIG. 2.

FIG. 1 is a partial layout diagram of a semiconductor substrate 2, and it illustrates an example of a high-frequency power transistor, formed in one chip 1, according to embodiment 1. FIG. 2 is a partial layout view of the semiconductor substrate, wherein some LDMOSes are illustrated in an enlarged state, and FIG. 3 is a partial sectional view of the semiconductor substrate, taken on A–A' line and B–B' line in FIG. 2. A first LDMOS $Tr_1$, as illustrated in FIGS. 2 and 3, constitutes a recurring minimum unit. A plurality of the first LDMOSes $Tr_1$, each of which is a unit element, are connected to each other in parallel. In this way, the high-frequency power transistor illustrated in FIG. 1 is formed.

The substrate 2, which constitutes the chip 1, has a structure wherein a p type semiconductor layer 2b (for example, an epitaxial layer formed by a gas-phase growth method or some other method) having a thickness of, e.g., about 10 μm is formed on a silicon substrate (semiconductor substrate) 2a made of $p^+$ type (first conductive type) silicon monocrystal having a resistivity of, e.g., about 1 to 15 mΩcm. A p type well 3 (fourth semiconductor region) is formed in the semiconductor layer 2b by introducing a p type impurity, such as boron, into the layer by use of ion implantation.

The first LDMOSes $Tr_1$, are formed in a main face of the substrate 2 (that is, a main face of the semiconductor layer 2b). The gate insulating film 4 of each of the LDMOSes $Tr_1$, is constituted by a relatively thin insulating film made of silicon oxide, and it is formed by, for example, a thermal oxidation method. A gate electrode 5 of the first LDMOS $Tr_1$ is formed by, for example, a method of patterning a polycrystal silicon film formed on the main face of the semiconductor layer 2b by a lithographic technique or etching technique, and a channel region (not illustrated) of the first LDMOS $Tr_1$ is formed in the upper portion of the p type well 3 below the gate electrode 5.

The source of the first LDMOS $Tr_1$ is made of an $n^+$ type (second conductive type) semiconductor region (first semiconductor region) 6, and this $n^+$ type semiconductor region 6 is formed in the p type well 3 in such a state that the region 6 extends to one end of the gate electrode 5. The drain of the first LDMOS $Tr_1$ is composed of an $n^-$ type semiconductor region (second semiconductor region) 7 and an $n^+$ type semiconductor region (third semiconductor region) having a higher n type impurity concentration than the $n^-$ type semiconductor region. The $n^-$ type semiconductor region 7 is formed in such a state that the region 7 extends to the other end of the gate electrode 5, and the $n^+$ semiconductor region 8 is formed so as to be spaced from the gate electrode 5 by the length of the $n^-$ type semiconductor region 7. The $n^-$ type semiconductor region 7 and the $n^+$ semiconductor regions 6 and 8 are each formed by the introduction of an n type impurity such as arsenic, by ion implantation or some other method.

In the semiconductor layer 2b, $p^+$ source penetrating layers 9 and 9a are formed by introducing a p type impurity, such as boron, into the layer 2b by ion implantation or some other method. The $p^+$ source penetrating layer (sixth semiconductor region) 9 contacts the $n^+$ type semiconductor region 6, which constitutes the source, and reaches the silicon substrate 2a from the surface of the semiconductor layer 2b. The $p^+$ source penetrating layer (fifth semiconductor region) 9a also reaches the silicon substrate 2a from the surface of the semiconductor layer 2b. The $p^+$ type source penetrating layer 9a is formed in the semiconductor layer 2b between a probe inspection source electrode pad, which is to be formed on the surface of the chip 1 and will be described later, and the silicon substrate 2a.

An insulating film 10 made of, e.g., silicon oxide is formed on the main face of the semiconductor layer 2b, so as to cover the gate electrode 5. On/in the insulating film 10, the following are formed: the $n^+$ type semiconductor region 6, which constitutes the source; the $n^+$ type semiconductor region 8, which constitutes the drain; the $p^+$ source penetrating layers 9 and 9a; and a contact hole 11 for exposing a leading portion 5a of the gate electrode 5.

On the insulating film 10, the following are formed: a source electrode 12a for connecting the $n^+$ type semiconductor region, which constitutes the source, and the p+ type source penetrating layer 9 to each other by means of a first-layer interconnection; a drain electrode 12b, which is connected to the n+ type semiconductor region 8, which constitutes the drain; a gate connecting electrode 12c, which is connected to the two adjacent gate electrodes 5; and a source leading-up electrode 12d, which is connected to the p+ type source penetrating layer 9a. These electrodes 12a to 12d can be formed by, for example, a method of patterning a metallic film, such as an aluminum alloy film, which is deposited on the insulating film 10 by lithographic technique or etching technique. An insulating film 13 made of, e.g., silicon oxide is formed to cover these electrodes 12a to 12d. On/in the insulating film 13, the following are formed: the drain electrode 12b; the gate connecting electrode 12c; and a contact hole 14 for exposing the source leading-up electrode 12d.

On the insulating film 13, the following are formed: a source electrode pad 15a, for probe inspection, which is electrically connected, through the source leading-up electrode 12d, to the p+ type source penetrating layer 9a by means of a second-layer interconnection; a drain electrode pad 15b which is electrically connected to the drain electrode 12b; and a gate electrode pad 15c which is electrically connected, through the gate connecting electrode 12c, to the gate electrode 5. In this way, the source electrode pad 15a, the drain electrode pad 15b, and the gate electrode pad 15c are formed on the front surface of the chip; therefore, all probes can be brought into contact with the chip 1 from the front surface side thereof in a probe inspection step for judging whether all chips are good or bad one by one. These electrode pads 15a to 15c can be formed by, for example, a method of patterning a metallic film, such as an aluminum alloy film, deposited on the insulating film 13 by a lithographic technique or etching technique.

Furthermore, a passivation film 16 is formed to cover these electrode pads 15a to 15c. Openings 17 are formed for exposing the electrode pads 15a to 15c. These electrode pads 15a to 15a are not formed on scribing areas, which have a width of about 100 μm and become cutting margins when the wafer is cut into individual chips, but are formed on an area other than the scribing areas, that is, on an element-forming area in the chip 1.

A rear surface electrode 18, which is made of, e.g., a metal film, is formed on the rear surface (the surface opposite to the surface on which the semiconductor layer 2b is formed) of the silicon substrate 2a. The n+ type semiconductor region 6, which constitutes the source, is electrically connected, through the source electrode 12 and the p+ type source penetrating layer 9, to the rear surface electrode 18. This rear surface electrode 18 functions as an electrode for the source of the first LDMOS $Tr_1$ when the high-frequency power transistor is driven. In other words, the source electrode pad 15a, which is formed on the front surface side of the chip 1, is used for probe inspection, and the rear electrode 18 is used, as the electrode for the source, to drive the high-frequency power transistor.

Before the rear electrode 18 is formed on the rear surface of the silicon substrate 2, the thickness from the surface of the passivation film 16 to the rear surface of the silicon substrate 2a is set to 200 μm or less by polishing the silicon substrate 2a. By making the silicon substrate 2a thin in this way, the resistance or the inductance of the source can be reduced. The source electrode pad 15a for probe inspection is electrically connected, through the p+ type source penetrating layers 9 and 9a formed in the semiconductor layer 2b and the silicon substrate 2a, to the source electrode 12 without leading around the first-layer or second-layer interconnection. Therefore, an increase in parasitic capacitance can be suppressed even if the source electrode pad 15a is formed on the front surface side of the chip 1.

Figure 4A:
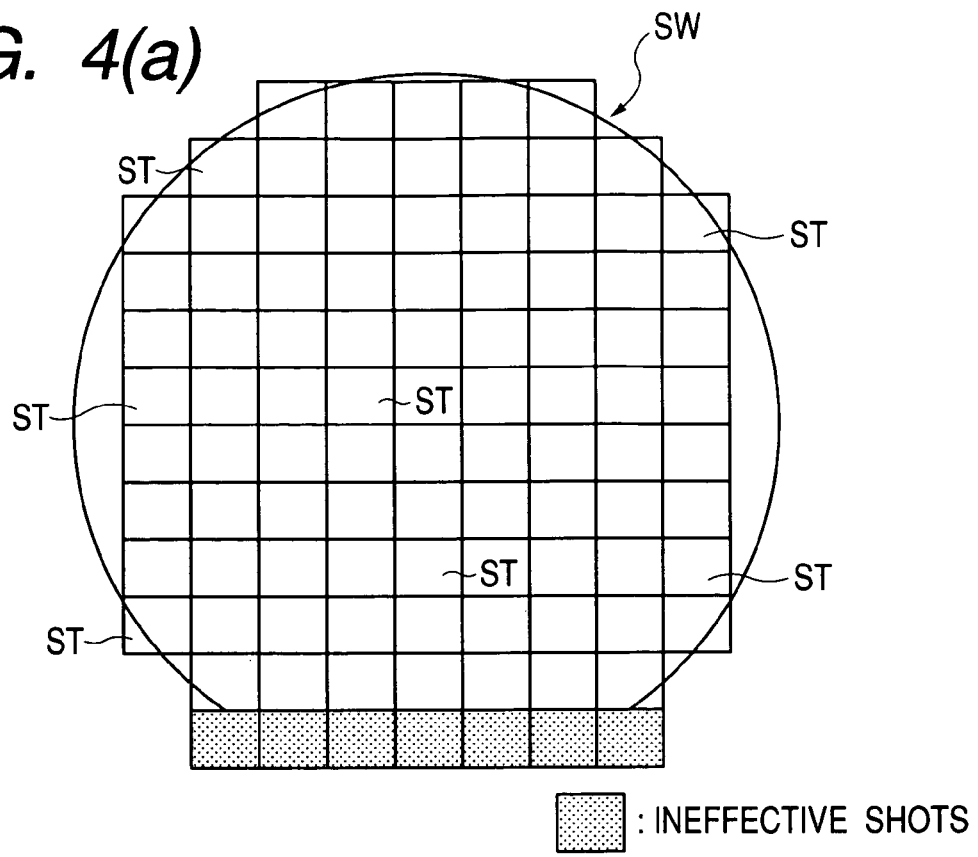
FIG. 4(a) is a diagram which illustrates a matrix formed by one shot in a light-exposing step of a lithographic technique.
Figure 4B:
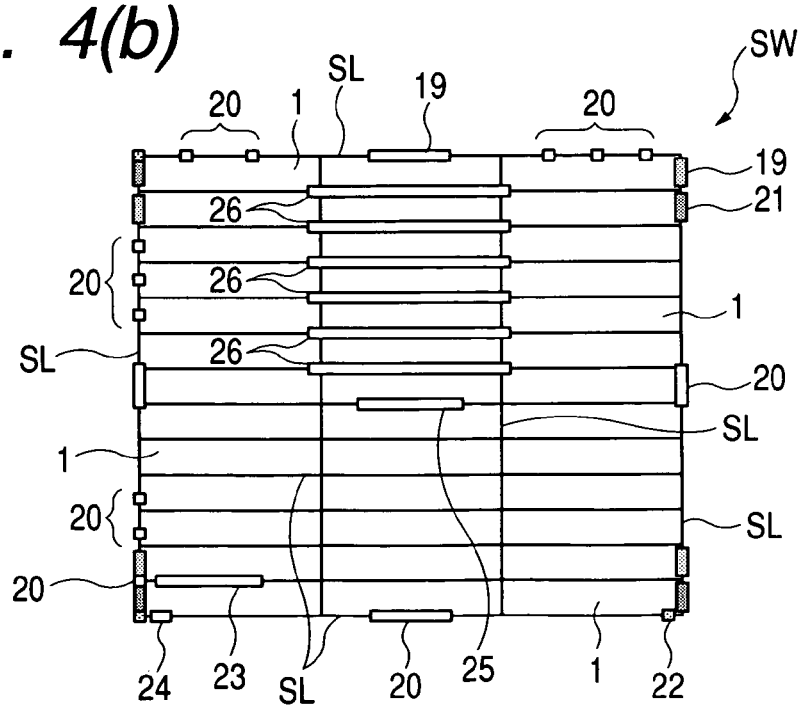
FIG. 4(b) is a layout diagram of patterns formed by the one shot.

FIG. 4(a) illustrates a matrix formed by one shot in the light-exposing step of a lithographic technique, and FIG. 4(b) illustrates an example of the layout of various patterns formed in scribing areas by the one shot. In FIG. 4(b), reference number 1 represents one chip, symbol SW represents a wafer, and symbol SL represents the scribing areas, which become cutting margins when the wafer is cut and divided into individual chips, which margins are formed at the four sides of each of the chips. The term "one shot" means one light-exposing operation in a lithographic technique. Usually, plural chips (39 chips in FIG. 4(b)) are exposed to light by the one shot.

In the outermost scribing area SL formed by the one shot ST, the following are arranged: canceling preventing patterns 19, alignment marks 20, alignment patterns 21, a (long-size) pattern 22 for mask QC, a film thickness inspection pattern 23, a scanning electron microscope (SEM) original point pattern 24, and so on. In the inner scribing areas SL formed by the one shot ST, the following are arranged: a (small-size) pattern 25 for mask QC, test element group (TEG) patterns 26, and so on. As described with respect to the first LDMOS $Tr_1$, however, in the high-frequency power transistor of the present embodiment 1, the source electrode pad is formed on an area other than the scribing areas SL, that is, on the element-forming area in the chip 1, wherein the high-frequency power transistor is formed. Therefore, the source electrode pad can be formed on every chip 1 without deleting the above-mentioned various patterns formed in the scribing areas SL.

The following description is directed to a first probe inspection method and a second probe inspection method for the high-frequency power transistor of the present embodiment 1. The first probe inspection method will be described with reference to FIGS. 5(a) to 5(g), and subsequently the second probe inspection method will be described with reference to FIGS. 6(a) to 6(i).

Figure 5A:
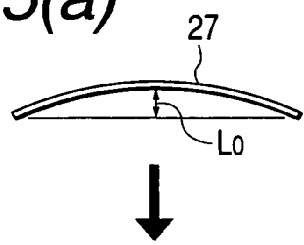
FIGS. 5(a) to 5(g) are diagrams illustrating steps in a first probe inspection method for the high-frequency power transistor of embodiment 1.

The first probe inspection method is performed, for example, as follows. As illustrated in FIG. 5(a), a wafer (substantially-circular flat substrate having arranged plural chips wherein LDMOSes are formed) 27 is first prepared. Since the thickness from the surface of the passivation film (represented by reference number 16 in the above-mentioned first LDMOS $Tr_1$) to the rear surface of the silicon substrate (represented by reference number 2a in the first LDMOS $Tr_1$) is set to 200 μm or less, a warp of about 4 mm (=a distance represented by Lo in FIG. 5(a)) is generated.

Figure 5B:
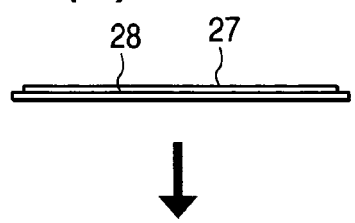
Figure 5C:
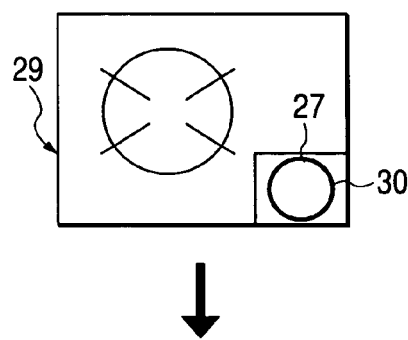

Next, as illustrated in FIG. 5(b), a reinforcing tape 28 is adhered to the rear surface of the wafer 27 to decrease the warp of the wafer 27. An example of the reinforcing tape 28 may be a UV tape (i.e., a tape having a chemical property which can be changed by ultraviolet rays). Next, as illustrated in FIG. 5(c), the wafer 27, to which the reinforcing tape 28 is adhered, is put onto a stage 30 of a probe inspection device 29, and then the wafer 27 is fixed onto the stage 30 by vacuum adsorption. Since the reinforcing tape 28 causes a decrease in the warp of the wafer 27 at this time, the wafer 27 is not strongly struck on the stage 30 even if the wafer 27 is attracted to the stage 30 by the vacuum adsorption. As a result, the wafer 27 can be prevented from being broken or cracked.

Figure 5D:
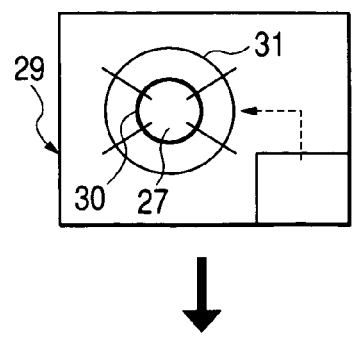
Figure 5E:
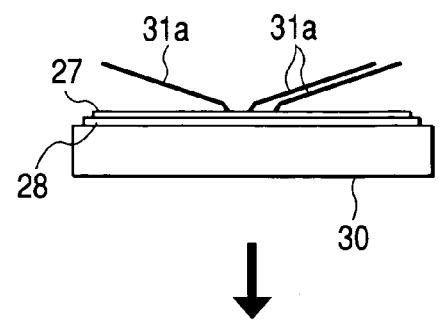

Next, as illustrated in FIG. 5(d), the stage 30, on which the wafer 27 is mounted, is shifted to a probe measurement section 31. Next, as illustrated in FIG. 5(e), a probe 31a is brought into contact with each of the source electrode pad (represented by reference number 15a in the first LDMOS Tr$_1$), the drain electrode pad (represented by reference number 15b in the first LDMOS Tr$_1$) and the gate electrode pad (represented by reference number 15c in the first LDMOS Tr$_1$), which are formed on the front surface side of the wafer 27. In this way, the characteristic of each of the chips is measured. Since the reinforcing tape 28 is adhered to the rear surface of the wafer 27, the rear surface electrode 18 cannot be used as any electrode for the source. However, instead of this, the source electrode pad formed on the front surface side of the wafer 27 is used in the probe inspection. A probe card wherein probes are arranged beforehand in accordance with the arrangement of all of the electrode pads of the high-frequency power transistor may be used.

Figure 5F:
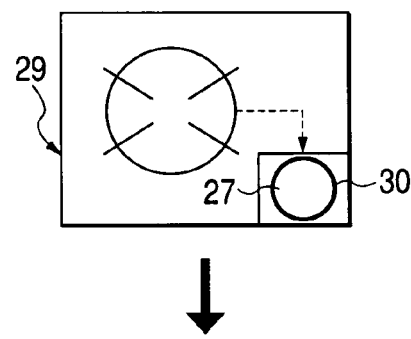
Figure 5G:
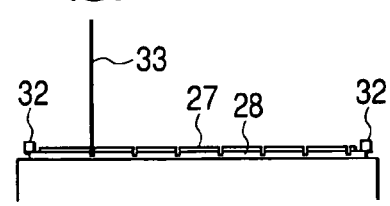

Next, as illustrated in FIG. 5(f), the stage 30, on which the wafer 27 is mounted, is shifted to the position where the wafer 27 is initially set after completion of the measurement. Next, as illustrated in FIG. 5(g), the wafer 27 is cut and divided into individual chips (a dicing step), and subsequently, the chips that are accepted are peeled from the reinforcing tape 28. The accepted chips are further subjected to a mounting step and a bonding step, and then the chips are sealed up in a package. In the dicing step, in the state in which the reinforcing tape 28 is adhered to the rear surface of the wafer 27, the periphery of the reinforcing tape 28 is bonded and fixed onto a carrier tool 32. Thereafter, a diamond blade (i.e., a very thin circular edge onto which fine diamond particles are adhered) 33 or the like is used to dice the wafer 27, thereby cutting the wafer 27 lengthwise and crosswise in line with the scribing areas. In this way, the chips are separated from each other. Accordingly, the reinforcing tape 28 also functions as a dicing tape, whereby the wafer 27 can be transferred from the probe inspection device 29 to the dicing device in the state in which the reinforcing tape 28 is adhered on the wafer 27; therefore, the wafer 27 can easily be handled, and, further, no work for adhering any independent dicing tape becomes necessary. Consequently, the number of steps in the handling of the wafer 27 is reduced, so that breaking of the wafer 27 can be decreased. In the dicing, the wafer 27 is cut in line with the scribing areas, but a part of the scribing areas remains around each of the chips after the dicing.

The second probe inspection method is performed, for example, as follows. In the same way as illustrated in FIGS. 5(a) to 5(f), a reinforcing tape 28 is adhered to the rear surface of a wafer 27 to decrease the warp of the wafer 27 (FIG. 6(b)). Thereafter, the wafer 27, to which the reinforcing tape 28 is adhered, is put onto a stage 30 of a probe inspection device 29, and then the wafer 27 is fixed onto the stage 30 by vacuum adsorption (FIG. 6(c)). Next, the stage 30, on which the wafer 27 is mounted, is shifted to a probe measurement section 31 (FIG. 6(d)), and then a probe 31a is brought into contact with each of the source electrode pad (represented by reference number 15a in the first LDMOS Tr$_1$), the drain electrode pad (represented by reference number 15b in the first LDMOS Tr$_1$) and the gate electrode pad (represented by reference number 15c in the first LDMOS Tr$_1$), which are formed on the front surface side of the wafer 27, so as to measure the characteristic of each of the chips (FIG. 6(e)). In this second inspection measurement, instead of the rear surface electrode 18, the source electrode pad formed on the front surface side of the wafer 27 is used, as well. Next, the stage 30, on which the wafer 27 is mounted, is shifted to the position where the wafer 27 is initially set after completion of the measurement (FIG. 6(f)).

Figure 6A:
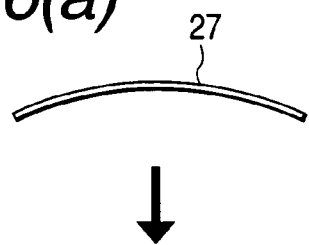
FIGS. 6(a) to 6(i) are diagrams illustrating steps in a second probe inspection method for the high-frequency power transistor of embodiment 1.
Figure 6B:
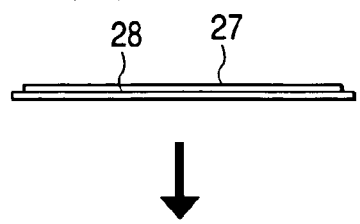
Figure 6C:
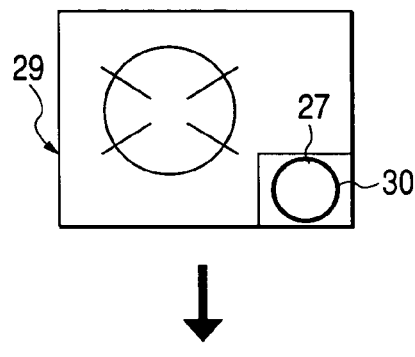
Figure 6D:
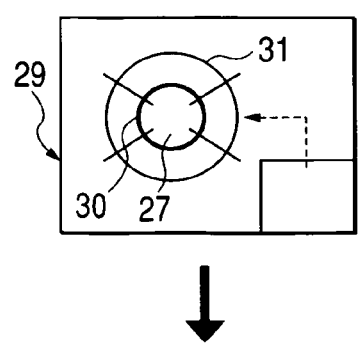
Figure 6E:
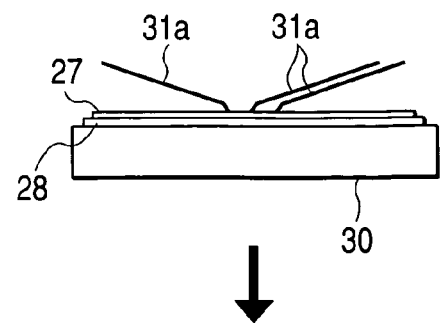
Figure 6F:
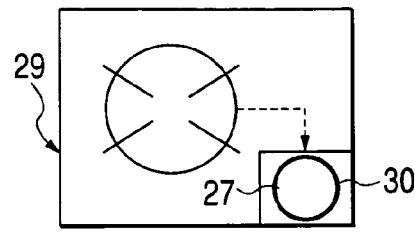
Figure 6G:
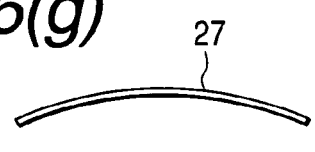
Figure 6H:
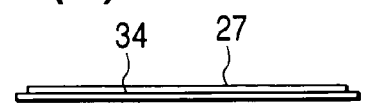
Figure 6I:
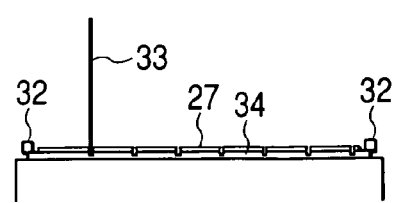

Next, as illustrated in FIG. 6(g), the reinforcing tape 28 is peeled from the rear surface of the wafer 27 and subsequently, as illustrated in FIG. 6(h), a dicing tape 34 is adhered to the rear surface of the wafer 27. Thereafter, the wafer 27 is cut and divided into individual chips (a dicing step), and then the chips that are accepted are peeled from the dicing tape 34. The accepted chips are further subjected to a mounting step and a bonding step, and then the chips are sealed up in a package. The reinforcing tape 28, which is adhered on the rear surface of the wafer 27, is peeled therefrom, and, instead of the tape 28, the dicing tape 34 is adhered to the rear surface, whereby the flexibility for selection of the material for each of the tapes can be increased.

Figure 7:
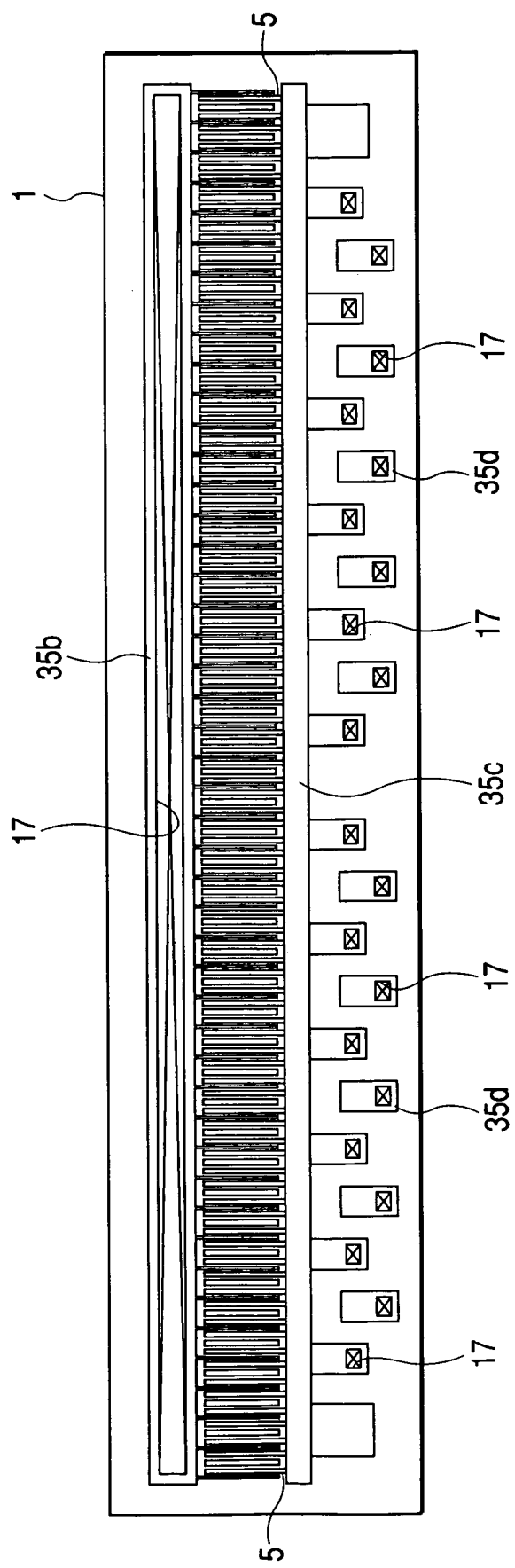
FIG. 7 is a partial layout diagram of a semiconductor substrate and illustrates another example of one high-frequency power transistor, formed on one chip, according to embodiment 1.
Figure 8:
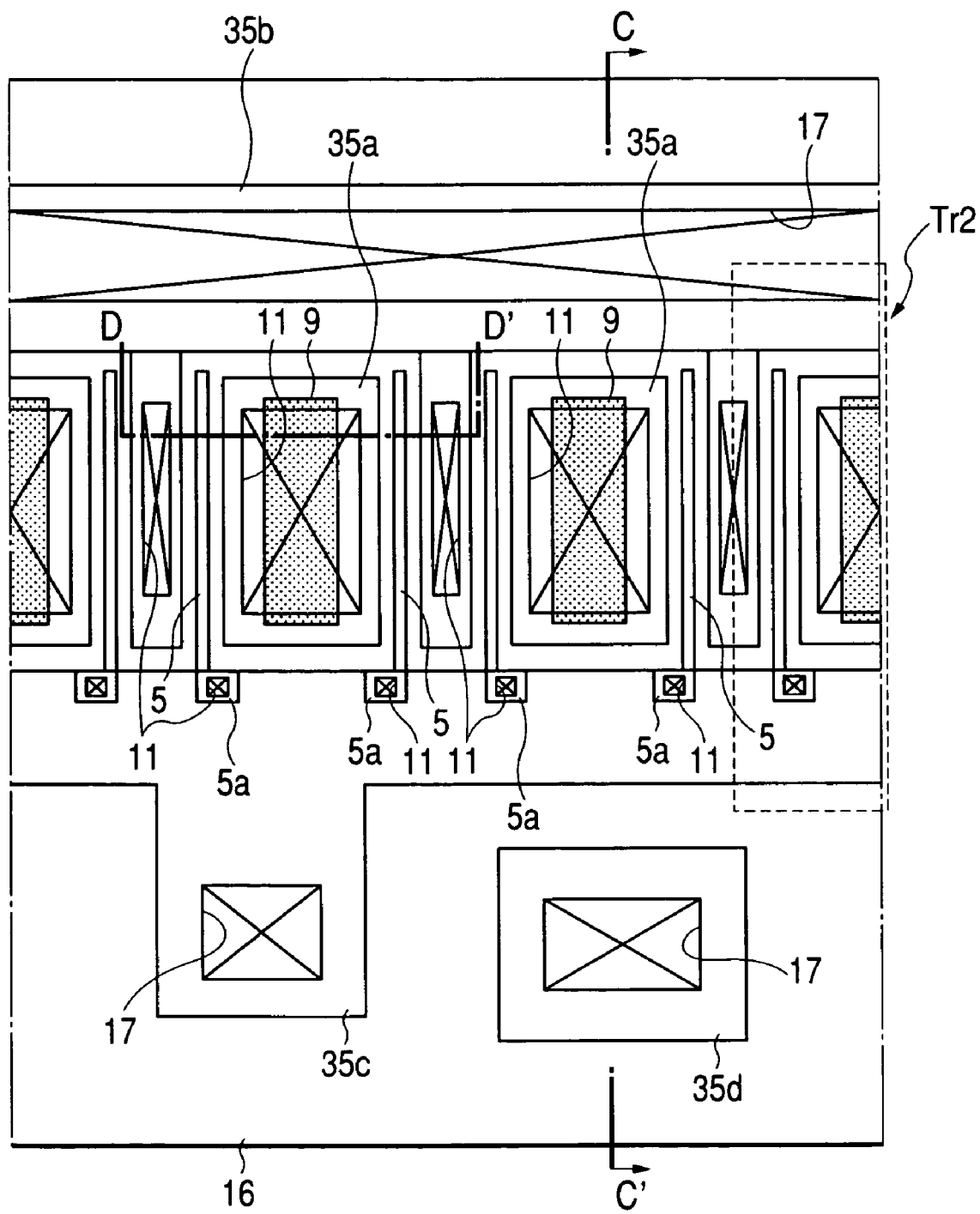
FIG. 8 is a partial layout diagram of the semiconductor substrate wherein some of the LDMOSes illustrated in FIG. 7 are illustrated so as to be enlarged.
Figure 9:
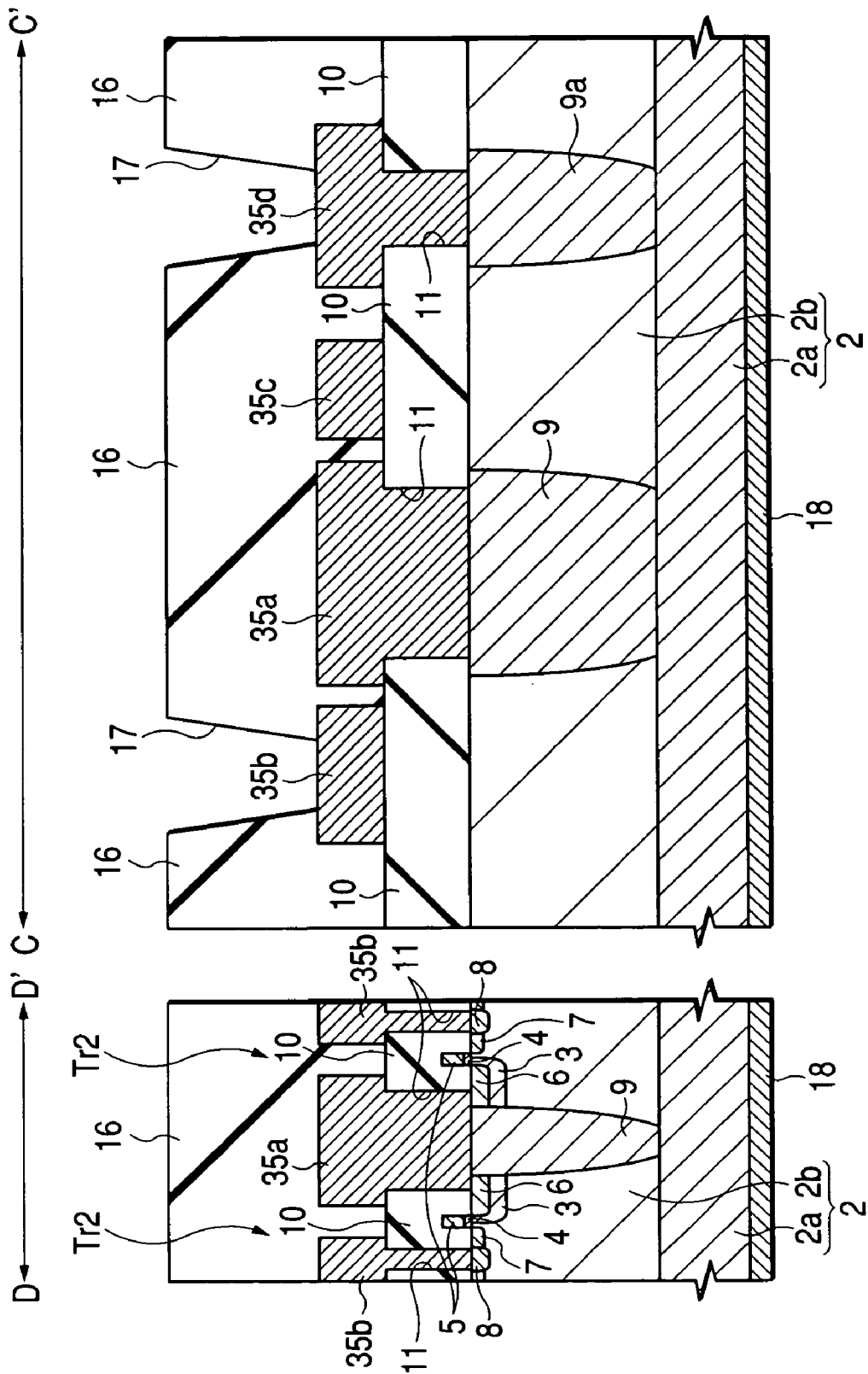
FIG. 9 is a partial sectional view of the semiconductor substrate, taken on a line C–C' and a line D–D' in FIG. 8.

FIG. 7 is a partial layout view of a semiconductor substrate 2, and it illustrates another example of the high-frequency power transistor, formed in one chip, according to the present embodiment 1. FIG. 8 is a partial layout view of the semiconductor substrate, wherein some LDMOSes Tr$_2$ are illustrated in an enlarged state, and FIG. 9 is a partial sectional view of the semiconductor substrate, taken on line C–C' and line D–D' in FIG. 8.

In the same manner as the first LDMOS Tr$_1$, each of the second LDMOSes Tr$_2$ is composed of a p type well 3, a gate insulating film 4, a gate electrode 5, a source which is made of an n$^+$ type semiconductor region 6, a drain which is composed of an n$^-$ type semiconductor region 7 and an n$^+$ type semiconductor region 8, and p$^+$ type source penetrating layers 9 and 9a on/in a substrate 2. However, in the second LDMOS Tr$_2$, each electrode pad is made of a first layer interconnection.

In other words, on an insulating film 10 that is formed on a main face of a semiconductor layer 2b, the following are formed: a source electrode 35a, made of a first layer interconnection, for connecting the n$^+$ type semiconductor region 6, which constitute the source, and the p$^+$ type source penetrating layer 9 to each other; a drain electrode pad 35b connected to the n$^+$ type semiconductor region 8, which constitutes the drain; a gate electrode pad 35c connected to a leading-out portion 5a of the gate electrode 5; and a source electrode pad 35d connected to the p$^+$ type source penetrating layer 9a. The electrode pads 35b to 35d are made of the first layer interconnection and formed on the front surface side of the chip 1. The electrode 35a and the electrode pads 35b to 35d can be formed by, for example, a method of patterning a metallic film, such as an aluminum alloy film, deposited on the insulating film 10 by a lithographic technique or etching technique.

In the present embodiment 1, the wafer 27 is subjected to dicing (i.e., for cutting the scribing areas with a diamond blade) when the wafer 27 is cut and divided into individual chips. However, the wafer 27 may be subjected to scribing (i.e., scoring the scribing areas with a blade and splitting the wafer) to divide the wafer into individual chips.

As described above, according to the present embodiment 1, in order to lower the inductance or the resistance of the source, the LDMOS Tr$_1$ or Tr$_2$ is formed on the main face of the substrate 2, and, subsequently, the rear surface of the silicon substrate 2a is polished to set the thickness from the surface of the passivation film 16 to the rear surface of the silicon substrate 2a to 200 μm or less. However, by adhering the reinforcing tape 28 onto the rear surface of the wafer 27 (i.e., the rear surface of the silicon substrate 2a), breaking of the wafer 27 can be decreased in the vacuum adsorption of the wafer 27, the transportation of the wafer 27, and other operations. In the case where the reinforcing tape 28 is adhered on the rear surface of the wafer 27, probe inspection is performed using the source electrode pads 15a and 35d formed on the front surface side of the chip 1. In this case, the n⁺ type semiconductor region 6, which constitutes the source, is electrically connected to the source electrode pads 15a and 35d through the p⁺ type source penetrating layers 9 and 9a, which are formed in the semiconductor layer 2b, and the silicon substrate 2a without leading round the first-layer or second-layer interconnection. Therefore, an increase in parasitic capacitance can be suppressed, the increase being based on the formation of the source electrode pads 15a and 35d on the front surface side of the chip 1. Since the source electrode pads 15a and 35d are formed on the area other than the scribing areas SL, that is, on the element-forming area in the chip 1, the source electrode pads 15a and 35d can be provided in every chip 1 without deleting the above-mentioned various patterns formed in the scribing areas SL.

Embodiment 2

Figure 10:
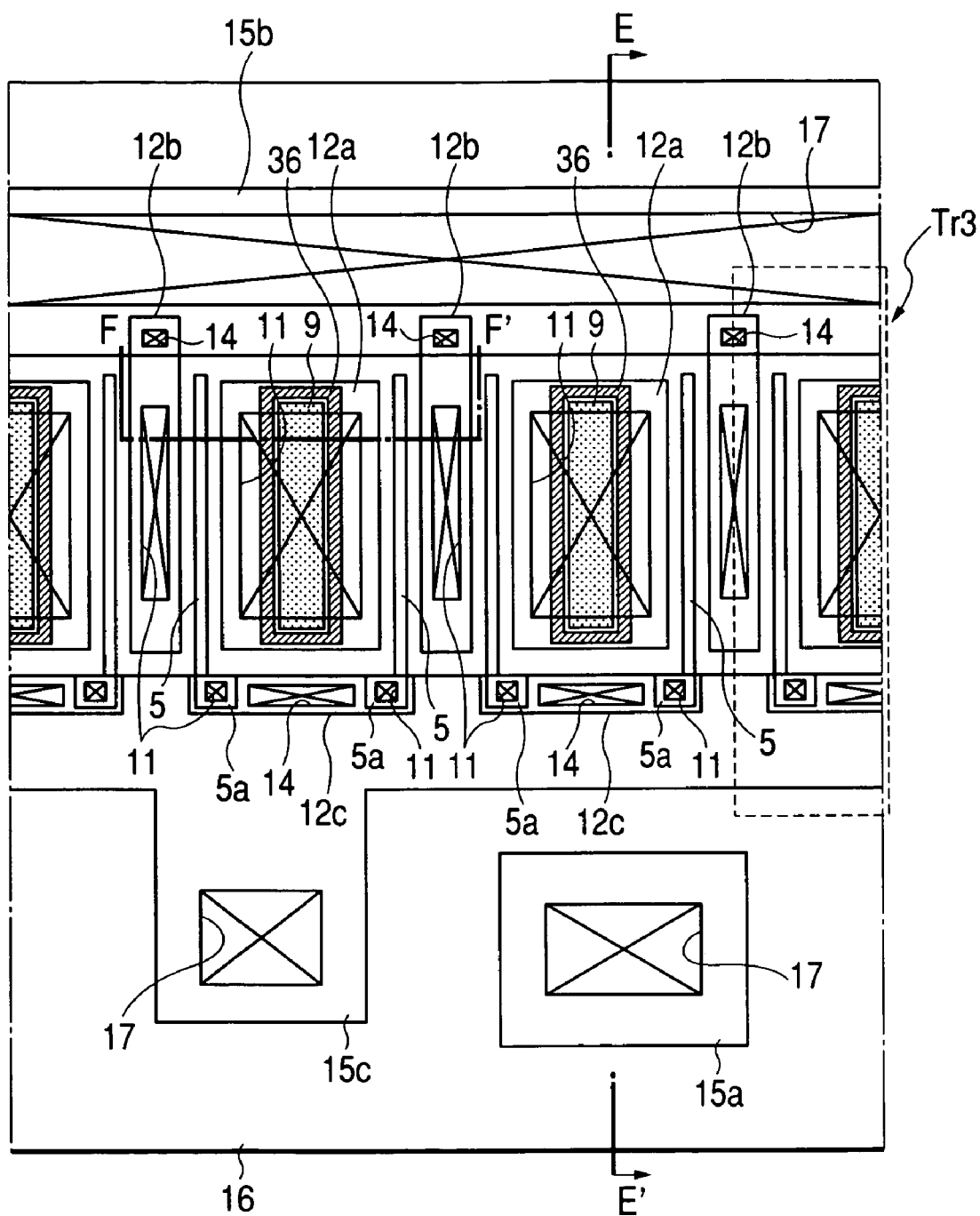
FIG. 10 is a partial layout diagram of a semiconductor substrate and illustrates an example of LDMOSes according to embodiment 2.
Figure 11:
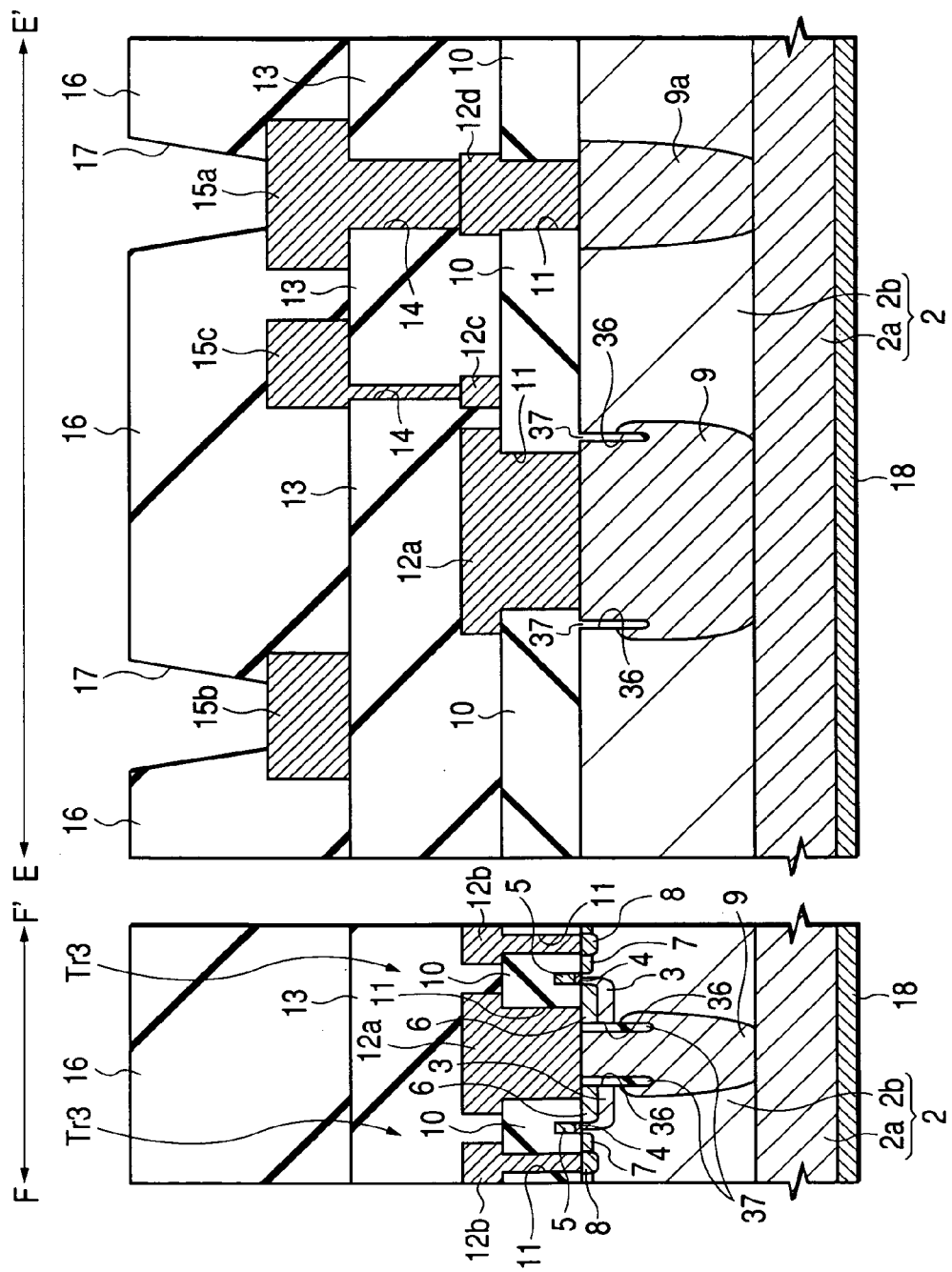
FIG. 11 is a partial sectional view of the semiconductor substrate, taken on line E–E' and line F–F' in FIG. 10.

FIG. 10 is a partial layout diagram of a semiconductor substrate, and it illustrates an example of LDMOSes Tr₃ of embodiment 2, and FIG. 11 is a partial sectional view taken on line E–E' and line F–F' in FIG. 10.

Each of the third LDMOSes Tr₃ has substantially the same structure as the first LDMOS Tr₁ of the above-mentioned embodiment 1. However, a trench 3 having a thickness of 2 μm or more is formed between a region to which a p type impurity is diffused when the p⁺ type source penetrating layer 9 is formed and the channel region of the third LDMOS Tr₃ in such a manner that the trench 3 extends from the surface of the semiconductor layer 2b toward the silicon substrate 2a. This trench 36 is made before the p⁺ type source penetrating layer 9 is formed, so as to have a function for preventing the p⁺ type source penetrating layer 9 from spreading up to the channel region. An insulating film 37 or a conductive film (made of tungsten, polycrystal silicon or the like) is embedded in the trench 36.

In the same manner as in the first LDMOS Tr₁ of the above-mentioned embodiment 1, in the third LDMOS Tr₃, the thickness from the surface of the passivation film 16 to the rear surface of the silicon substrate 2a is set to 20 μm or less, thereby making it possible to decrease the inductance or the resistance of the source.

Figure 12:
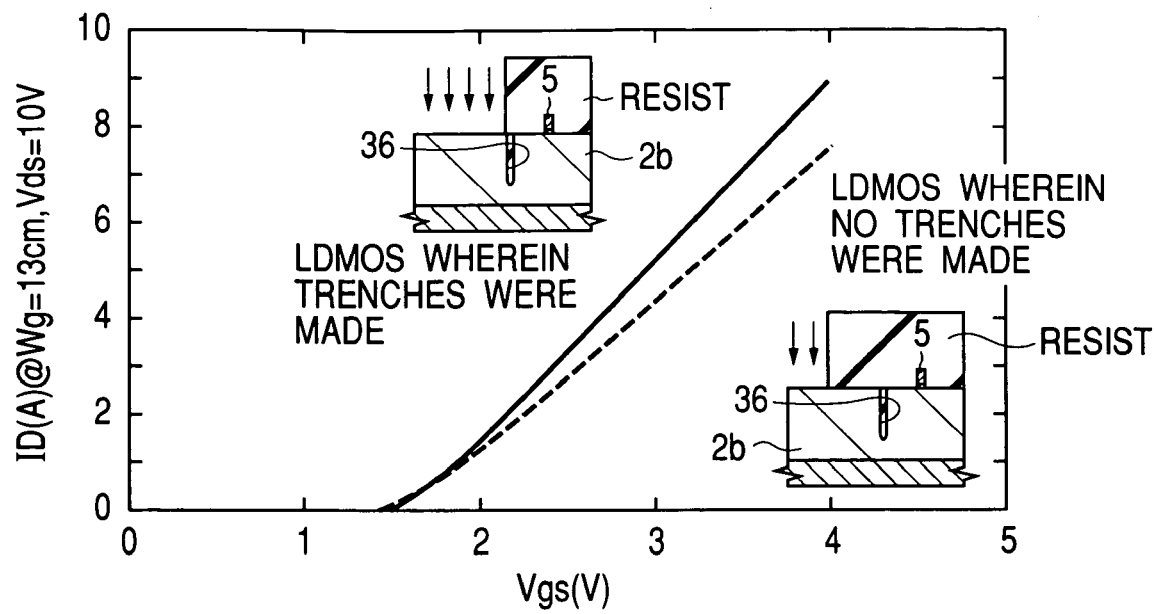
FIG. 12 is a graph of results showing the relationship between drain current and gate voltage in an LDMOS wherein a trench is made and an LDMOS wherein no trench is made, the results being obtained by simulation.

FIG. 12 shows the relationship between drain current (Id) and gate voltage (Vgs) in an LDMOS wherein a trench as described above is formed and an LDMOS wherein there is no trench, the results being obtained by simulation. As illustrated by schematic views of the LDMOSes in FIG. 12, in the LDMOS wherein the trench 36 is formed, a p type impurity for forming a p⁺ type source penetrating layer is introduced from a position spaced about 4 μm from one end of the gate electrode 5, and in the LDMOS wherein no trench 36 is formed, a p type impurity for forming a p⁺ type source penetrating layer is introduced from a position spaced about 7 μm from one end of the gate electrode 5. The depth and the width of the trench 36 are set to 2 μm and 1.8 μm, respectively, and the thickness of the semiconductor layer 2b is set to 10 μm. As understood from FIG. 12, the drain current of the LDMOS wherein the trench is provided is larger than that of the LDMOS wherein there is no trench, and in the LDMOS wherein the trench is provided, the gm where Id=(2.5 A–2.0 A)/ΔVgs can be made 20% larger than in the LDMOS wherein there is no trench.

Figure 13:
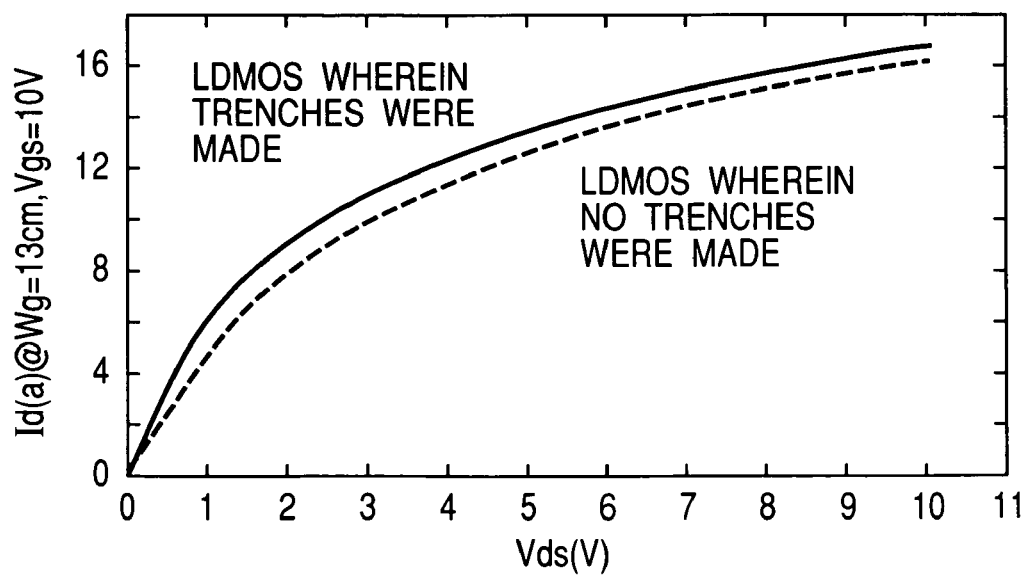
FIG. 13 is a graph of results showing the relationship between drain current and drain voltage in the LDMOS wherein the trench is made and the LDMOS wherein no trench is made, the results being obtained by simulation.

FIG. 13 shows the relationship between drain current (Id) and drain voltage (Vds) in an LDMOS wherein a trench as described above is formed and an LDMOS wherein there is no trench, the results being obtained by simulation. The structures of the LDMOSes are the same as illustrated by the schematic views of the LDMOSes inserted in FIG. 12. As understood from FIG. 13, in the LDMOS wherein the trench is provided, the Ron where Id=2.5 V can be made about 24.5% lower and the saturation current thereof can be made about 3.2% larger than in the LDMOS wherein there is no trench.

By making the trench in this way, the p⁺ type source penetrating layer can be prevented from spreading to the channel region; therefore, the p⁺ type source penetrating layer can be made wide or the impurity concentration in the p⁺ type source penetrating layer can be made higher without increasing the cell pitch of the LDMOS units. This can cause a reduction in the inductance or the resistance of the source and cause an improvement in the high-frequency power gain.

By making the trench, the cell pitch of the LDMOS units can be made small so as to shrink the chip. The chip shrinkage will be described with reference to FIGS. 14(a), 14(b) and 15(a), 15(b). In FIGS. 14(a), 14(b) and 15(a), 15(b), X and Y directions represent a gate length direction and a gate width direction, respectively.

FIG. 14(a) is a partial layout diagram of LDMOSes wherein there is no trench, and FIG. 14(b) is a partial layout diagram of LDMOSes wherein trenches are provided. In the layout of the LDMOSes wherein there are no trenches, as illustrated in FIG. 14(a), there are four gate electrodes 5. When the gate width thereof is represented by $L_1$, the gate width Wg of the whole of the layout is $(4 \times L_1)$ μm. Next, chip shrinkage is considered with respect to the arrangement of LDMOSes, wherein trenches are formed without changing the gate width Wg. In the LDMOS wherein the trench is made, the trench restrains the p⁺ type source penetrating layer from spreading out. Consequently, a shrinkage of the LDMOS can be attained in the X direction. When the shrinkage in the X direction is attained, the number of gate electrodes 5 which can be arranged can be set to, for example, six in the layout of the LDMOS wherein the trench is formed, as illustrated in FIG. 14(b). When the gate width is represented by L2, the gate width Wg of the whole of the layout can be represented by $(6 \times L_2)$ μm. Since the gate width Wg is unchangeable, the relationship represented by the equation "$4 \times L_2 = 6 \times L_2$" is satisfied. Thus, the equation $L_2 = (2/3) L_1$ is satisfied, so that L2 becomes smaller than $L_1$. That is, the shrinkage of the LDMOS in the X direction can cause the shrinkage thereof in the Y direction.

FIG. 15(a) is a partial layout diagram of LDMOSes, in each of which there is no trench, which are arranged into multiple rows, and FIG. 15(b) is a partial layout diagram of LDMOSes, in each of which a trench is formed, which are arranged into multiple rows. When the gate width Wu of each of the unit cells shown in FIG. 15(a) is represented by a μm, the gate width Wu of the whole of the layout shown in FIG. 15(a) is represented by (12×a) μm. In the LDMOSes wherein the trenches are formed, as illustrated in FIG. 15(b), the formation of the trenches restrains the p⁺ type source penetrating layer from spreading out. Consequently, a shrinkage of the LDMOSes in the X direction can be attained. Thus, if the X direction of the chip of the LDMOSes wherein no trenches are provided is equal to that of the chip of the LDMOSes wherein the trenches are provided, the same gate widths Wu((12×a) μm) can be realized by shrinking the X direction of the LDMOSes wherein the trenches are provided and then arranging LDMOSes (for example, four LDMOSes in the lower row in FIG. 15(a)) in an unoccupied area. In this way, the chip can be shrunk in the Y direction A first method for manufacturing the third LDMOSes in the order of its steps will be described with reference to FIGS. 16(a) to 18(b), which are partial sectional views of a semiconductor substrate.

Figure 16A:
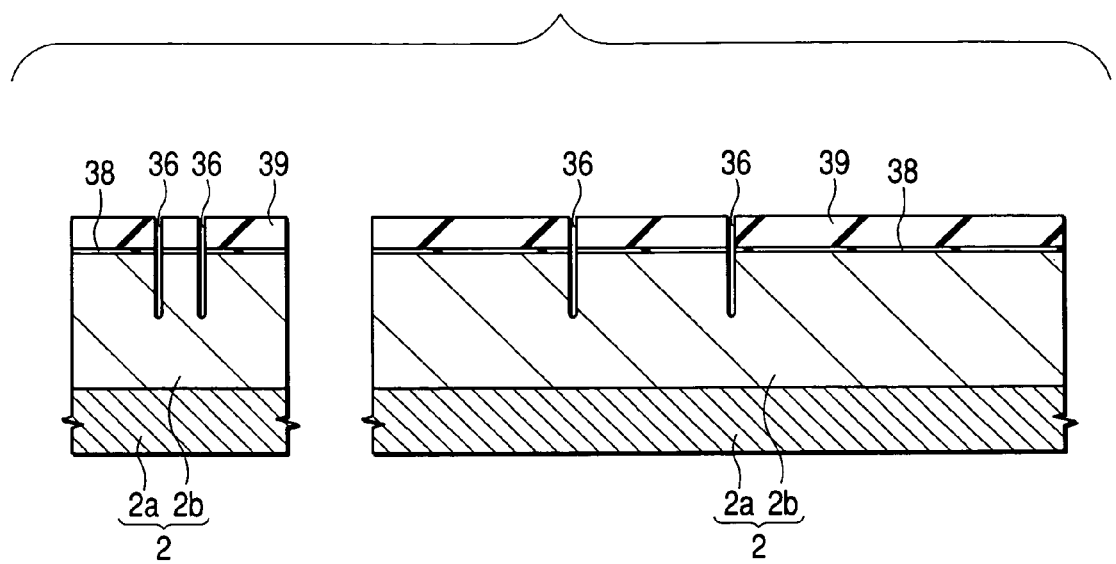
FIGS. 16(a) and 16(b) are partial sectional views illustrating a first method for manufacturing the LDMOSes of embodiment 2 in the order of its steps.

As illustrated in FIG. 16(a), a substrate 2 is first prepared. The substrate 2 at this stage is a substantially-circular flat member, and it has a silicon substrate 2a and a semiconductor layer 2b formed on a main face thereof. The silicon substrate 2a is made of, for example, $p^+$ type silicon monocrystal formed by a crystal pulling method, for example, the Czochralski method. The resistivity thereof is, for example, from 1 to 15 mΩcm. The semiconductor layer 2b is made of p type silicon monocrystal formed by, for example, an epitaxial method. The thickness thereof is about 10 μm.

Next, the substrate 2 is thermally oxidized to form a thin silicon oxide film 38 having a thickness of about 0.01 μm on the surface of the semiconductor layer 2b. Next, a silicon nitride film 39 having a thickness of about 0.1 μm is deposited thereon by chemical vapor deposition (CVD). Thereafter, a resist pattern is used as a mask to etch the silicon nitride film 39, the silicon oxide film 38 and the semiconductor layer 2b successively, thereby forming trenches 36 having a depth of 2 μm and a width of about 1.8 μm in the semiconductor layer 2b.

Figure 16B:
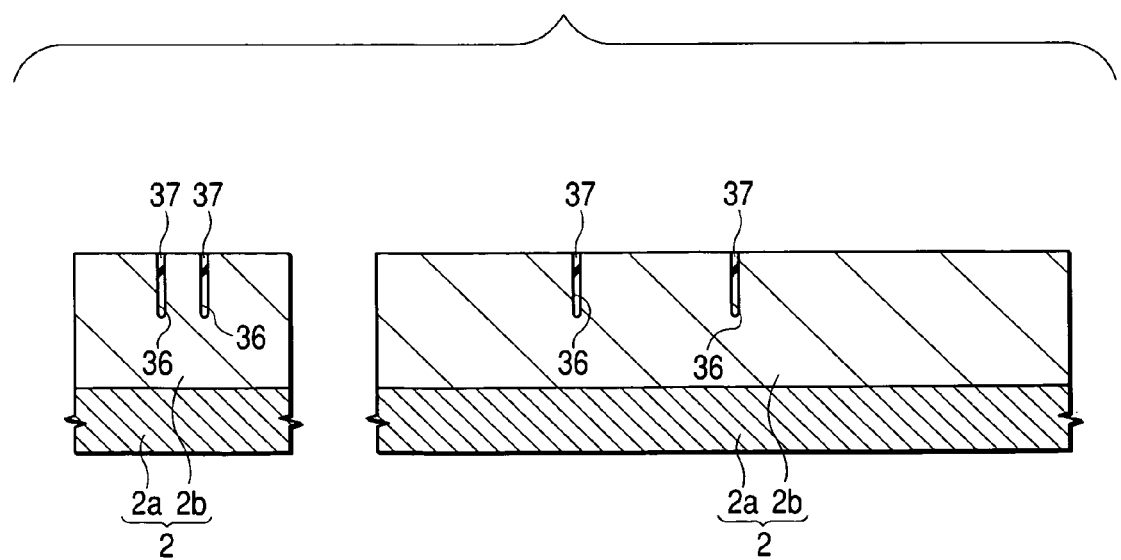

Next, as illustrated in FIG. 16(b), an insulating film 37, for example, a silicon oxide film is deposited on the semiconductor layer 2b by CVD, and then the insulating film 37 is polished by chemical mechanical polishing (CMP) to cause the insulating film 37 to remain inside the trenches 36. Subsequently, the substrate 2 is thermally treated to thermally tighten the insulating film 37 embedded in the trenches 3. Thereafter, hot phosphoric acid is used to remove the silicon nitride film 39, and subsequently an aqueous hydrofluoric acid type solution is used to remove the silicon oxide film 38.

Figure 17A:
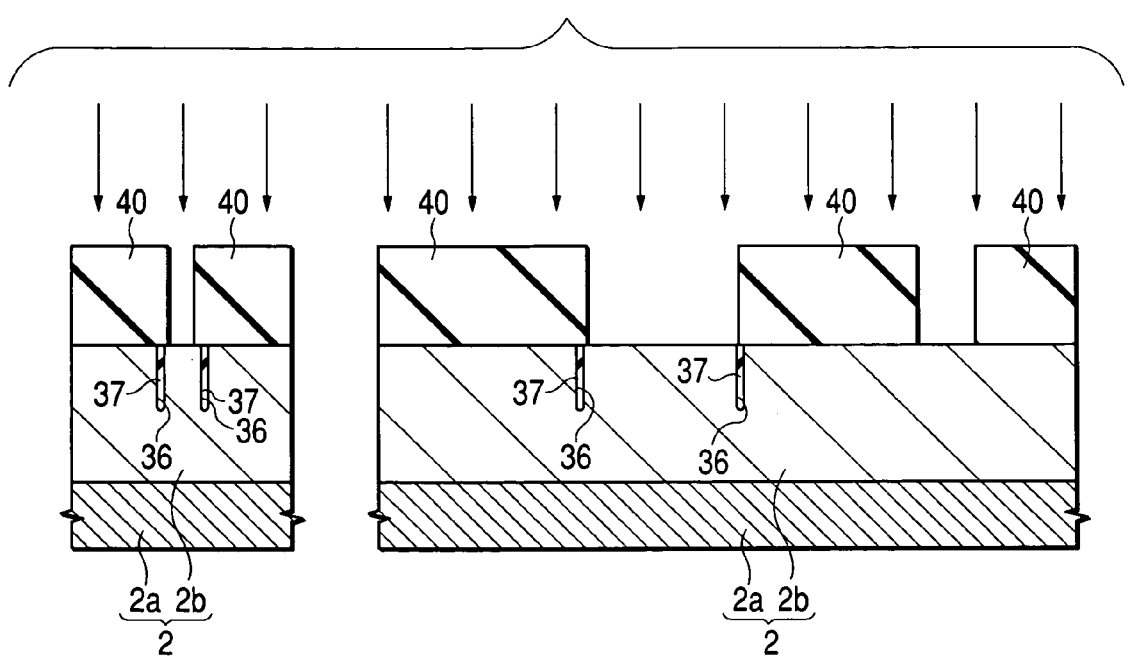
FIGS. 17(a) and 17(b) are partial sectional views illustrating the first method for manufacturing the LDMOSes of embodiment 2 in the order of its steps.
Figure 17B:
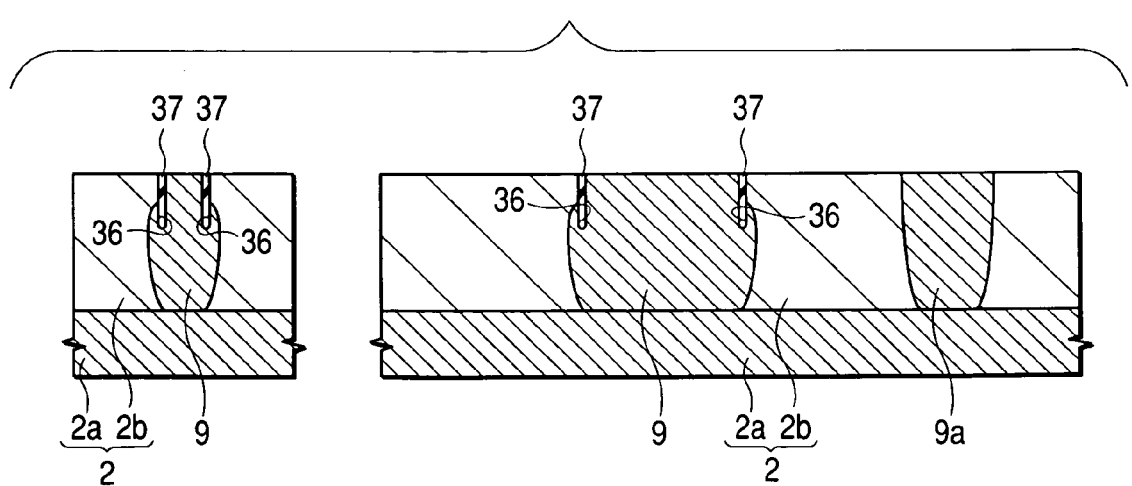

Next, as illustrated in FIG. 17(a), a resist pattern 40 is formed on the main face of the semiconductor layer 2b by a lithographic technique, and then the resist pattern 40 is used as a mask to ion⁻implant a p type impurity, such as boron, selectively into the semiconductor layer 2b under the following conditions: a dose in the order of $10^{16}$ cm$^{-2}$, and an energy of 100 keV. Subsequently, as illustrated in FIG. 17(b), the substrate 2 is subjected to thermal treatment, for example, at 1200° C. for 70 minutes to form $p^+$ type source penetrating layers 9 and 9a. The $p^+$ type source penetrating layers 9 and 9a are formed to extend from the surface of the semiconductor layer 2b to the silicon substrate 2a, and they are electrically connected to the silicon substrate 2a.

Figure 18A:
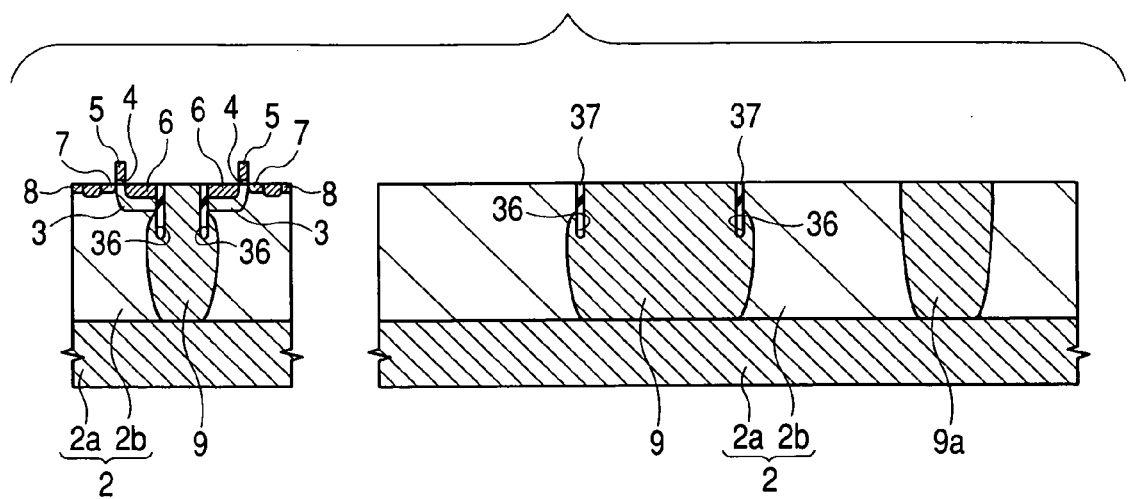
FIGS. 18(a) and 18(b) are partial sectional views illustrating the first method for manufacturing the LDMOSes of embodiment 2 in the order of its steps.

Next, as illustrated in FIG. 18(a), the resist pattern which covers some portions of the semiconductor layer 2b is used as a mask to ion⁻implant a p type impurity, such as boron, selectively into the semiconductor layer 2b under the following conditions: a dose in the order of $10^{13}$ cm$^{-2}$, and an energy of 60 keV. Subsequently, the substrate 2 is subjected to thermal treatment, for example, at 1000° C. for 30 minutes to form p type wells 3. The p type wells 3 also are portions which become channel regions of the third LDMOSes Tr$_3$.

Next, the substrate 2 is cleaned. In the state in which the cleaned main face of the semiconductor layer 2b is exposed, the substrate 2 is subjected to, for example, wet-oxidizing treatment to form a gate insulating film 4 made of silicon oxide and having a thickness of, e.g., about 10 to 50 μm on the surface of active areas in the semiconductor layer 2b. Subsequently, a conductive film made of, e.g., low-resistance polycrystal silicon is deposited on the main face of the substrate 2 by CVD. Thereafter, a resist pattern is used as a mask to pattern the conductive film by dry etching, so as to form gate electrodes 5 made of the conductive film.

Next, a resist pattern for exposing regions where drains are to be formed and covering the other regions is used as a mask on the main face of the substrate 2 to ion⁻implant an n type impurity, such as arsenic or phosphorus, into the semiconductor layer 2b, thereby forming n⁻ type semiconductor regions 7, each of which constitutes a portion of the drain. Each of the n⁻ type semiconductor regions 7 is formed in such a manner that one end thereof overlaps (or is substantially consistent) with the drain side end of the gate electrode 5. Thereafter, the substrate 2 is thermally treated.

Next, a resist pattern for exposing regions where sources and the other portions of the respective drains are to be formed and covering the other regions is used as a mask on the main face of the substrate 2 to ion⁻implant an n type impurity, such as arsenic, thereby forming $n^+$ type semiconductor regions 6, each of which constitutes the source, and $n^+$ type semiconductor regions 8, each of which constitutes the other portion of the drain. Each of the $n^+$ type semiconductor regions 8, which constitutes the other portion of the drain, is formed in such a manner that one end thereof is spaced from the gate electrode 5 by the length of the n⁻ type semiconductor region 7. Each of the $n^+$ type semiconductor regions 6, which constitutes the source, is formed in such a manner that one end thereof overlaps (or is substantially consistent) with the source side end of the gate electrode 5. Ion implantation conditions used in the formation of the $n^+$ type semiconductor regions 6 and 8 are, for example, as follows: a dose in the order of $10^{15}$ cm$^{-2}$, and an energy of 80 keV. Thereafter, the substrate 2 is thermally treated.

Figure 18B:
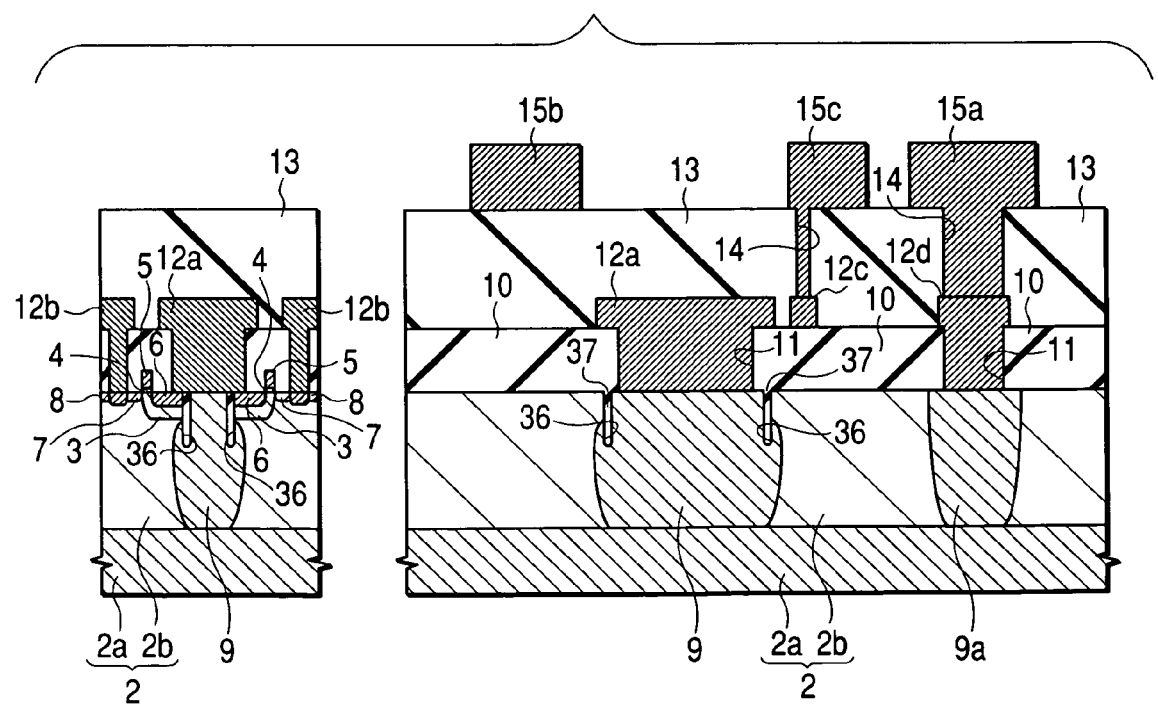

Next, as illustrated in FIG. 18(b), an insulating film 10 made of, e.g., silicon oxide is deposited on the main face of the substrate 2 by CVD. Subsequently, a lithographic technique and etching technique are used to form the following on/in the insulating film 10: $n^+$ type semiconductor regions 6, which constitute the sources; $n^+$ type semiconductor regions 8, which constitute the drains; $p^+$ type source penetrating layers 9 and 9a; and contact holes 11 for exposing leading-out portions of the gate electrodes 5. Next, a metallic film, such as an aluminum alloy film, is deposited on the main face of the substrate 2 by sputtering. Subsequently, the metallic film is patterned by a lithographic technique and etching technique, so as to make the following of first layer interconnections: source electrodes 12a for connecting $n^+$ type semiconductor regions 6, which constitute the sources, to the $p^+$ type source penetrating layer 9, drain electrodes 12b connected to the $n^+$ type semiconductor regions 8, which constitute the drains, gate connecting electrodes 12c connected to the two adjacent gate electrodes 5, and source leading-up electrodes 12d connected electrically to the $p^+$ type source penetrating layer 9a.

Next, an insulating film 13 made of silicon oxide or the like is deposited on the main face of the substrate 2 by CVD. Subsequently, contact holes 14 for exposing the drain electrodes 12b, the gate connecting electrodes 12c and the source leading-up electrodes 12d are formed in the insulating film 13 by a lithographic technique and etching technique. Next, a metallic film, such as an aluminum alloy film, is patterned on the main face of the substrate 2 by sputtering, so as to make the following of second layer interconnections: source electrode pads 15a connected electrically to the source leading-up electrodes, drain electrode pads 15b connected electrically to the drain electrodes 12b, and gate electrode pads 15c connected electrically to the gate connecting electrodes 12c. Thereafter, the main face of the substrate 2 is covered with a passivation film. Openings for exposing the electrode pads 15*a* to 15*c* are formed in the passivation film. In this way, the above-mentioned third LDMOSes Tr₃ are substantially finished.

A second method for manufacturing the third LDMOSes Tr₃ will be described in the order of its steps with reference to FIGS. 19(*a*) to 21, which are partial sectional views of a semiconductor substrate.

Figure 19A:
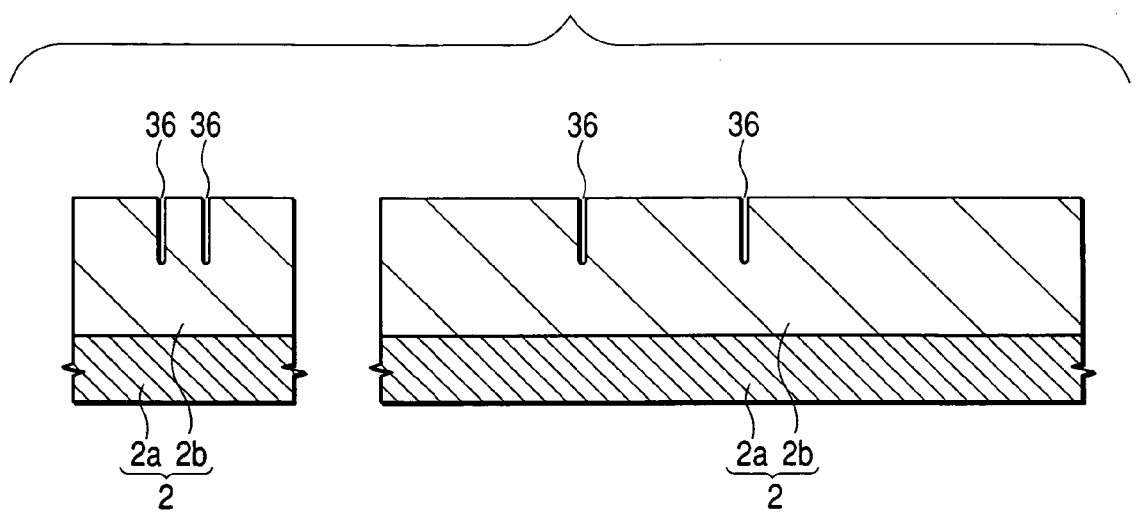
FIGS. 19(a) and 19(b) are partial sectional views illustrating a second method for manufacturing the LDMOSes of embodiment 2 in the order of its steps.
Figure 19B:
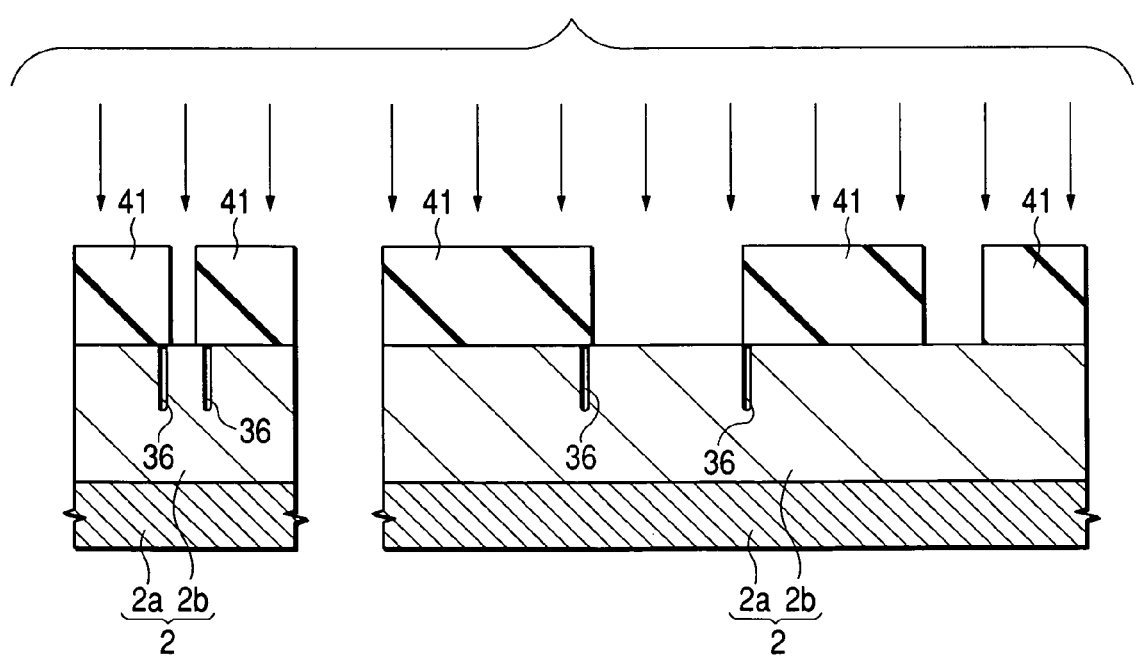

As illustrated in FIG. 19(*a*), a substrate 2 having a silicon substrate 2*a* and a semiconductor layer 2*b* formed on a main face thereof is first prepared and then trenches 36 are made in the same way as in the manufacture process described with reference to FIG. 16(*a*).

Next, as illustrated in FIG. 19(*b*), a resist pattern 41 is formed on the main face of the semiconductor layer 2*b* by a lithographic technique, and then the resist pattern 41 is used as a mask to ion implant a p type impurity, such as boron, selectively into the semiconductor layer 2*b* under the following conditions: a dose in the order of $10^{16}$ cm$^{-2}$, and an energy of 100 keV. Subsequently, as illustrated in FIG. 20(*a*), the substrate 2 is thermally treated, for example, at 1200° C. for 70 minutes to form p⁺ type source penetrating layers 9 and 9*a*.

Figure 20A:
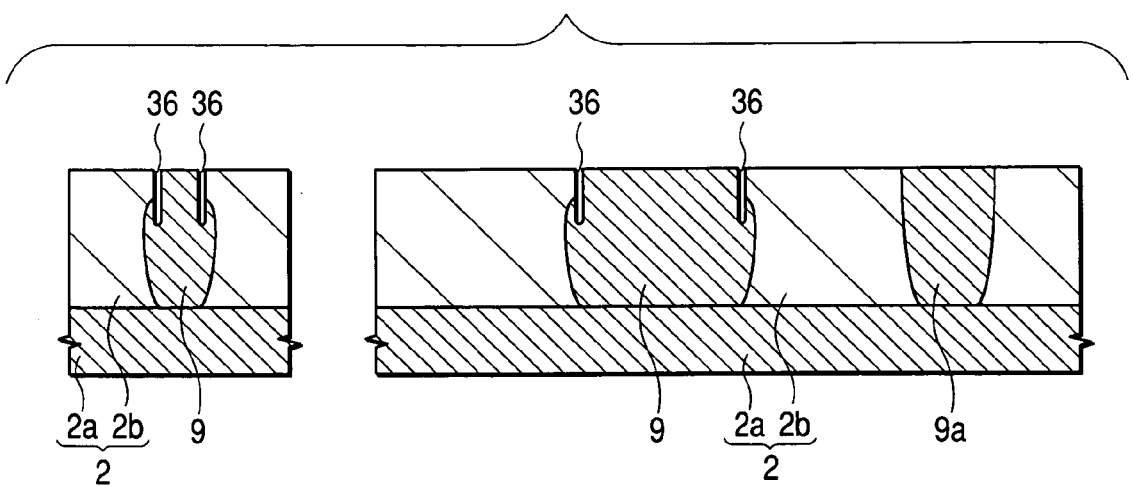
FIGS. 20(a) and 20(b) are partial sectional views illustrating the second method for manufacturing the LDMOSes of embodiment 2 in the order of its steps.
Figure 20B:
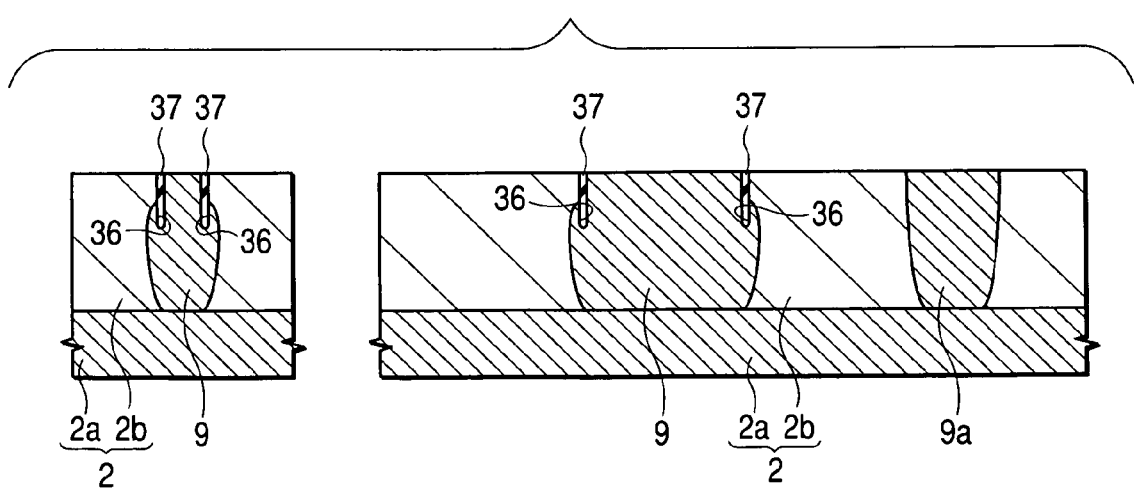

Next, as illustrated in FIG. 20(*b*), an insulating film 37, such as a silicon oxide film, is deposited on the semiconductor layer 2*b* by CVD. Thereafter, the insulating film 37 is polished by CMP, so as to cause the insulating film 37 to remain inside the trenches 36. Subsequently, the substrate 2 is thermally treated to thermally tighten the insulating film 37 embedded in the trenches 36. Thereafter, the third LDMOSes Tr₃ are formed in the same way as in the manufacture process described with reference to FIGS. 18(*a*) and 18(*b*).

Figure 21:
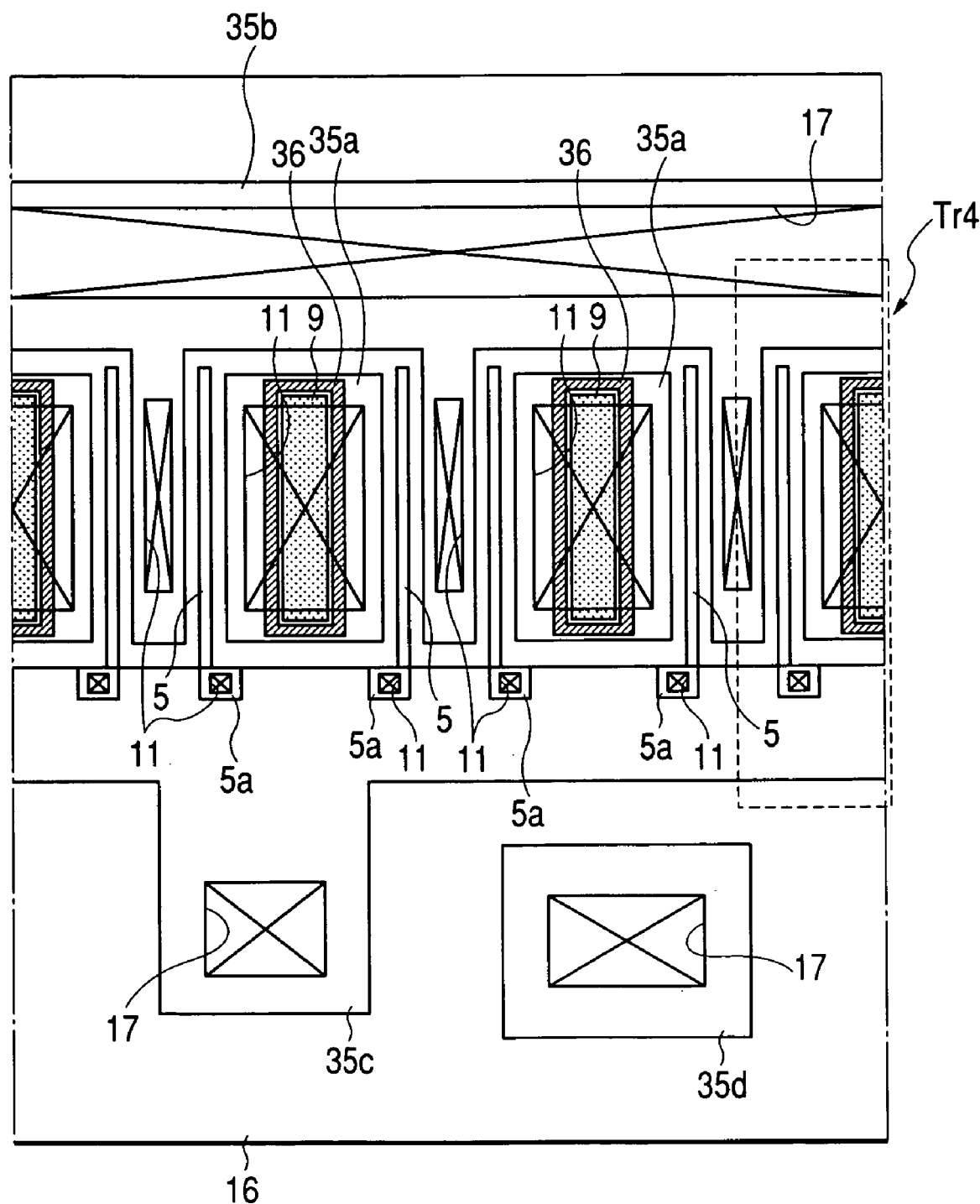
FIG. 21 is a partial layout diagram of a semiconductor substrate and illustrates a different example of the LDMOSes according to embodiment 2.
Figure 22:
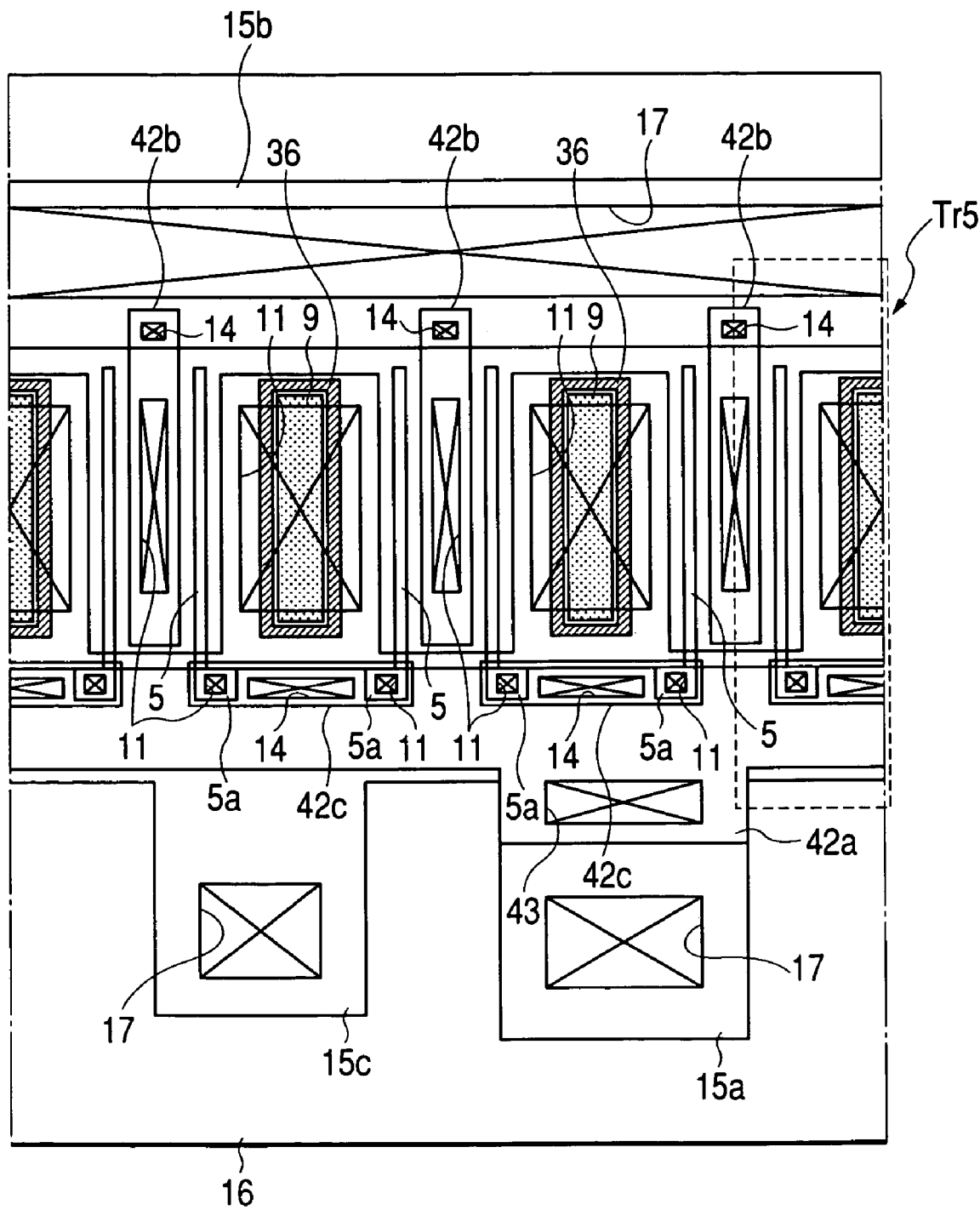
FIG. 22 is a partial layout diagram of a semiconductor substrate and illustrates a different example of the LDMOSes according to embodiment 2.
Figure 23:
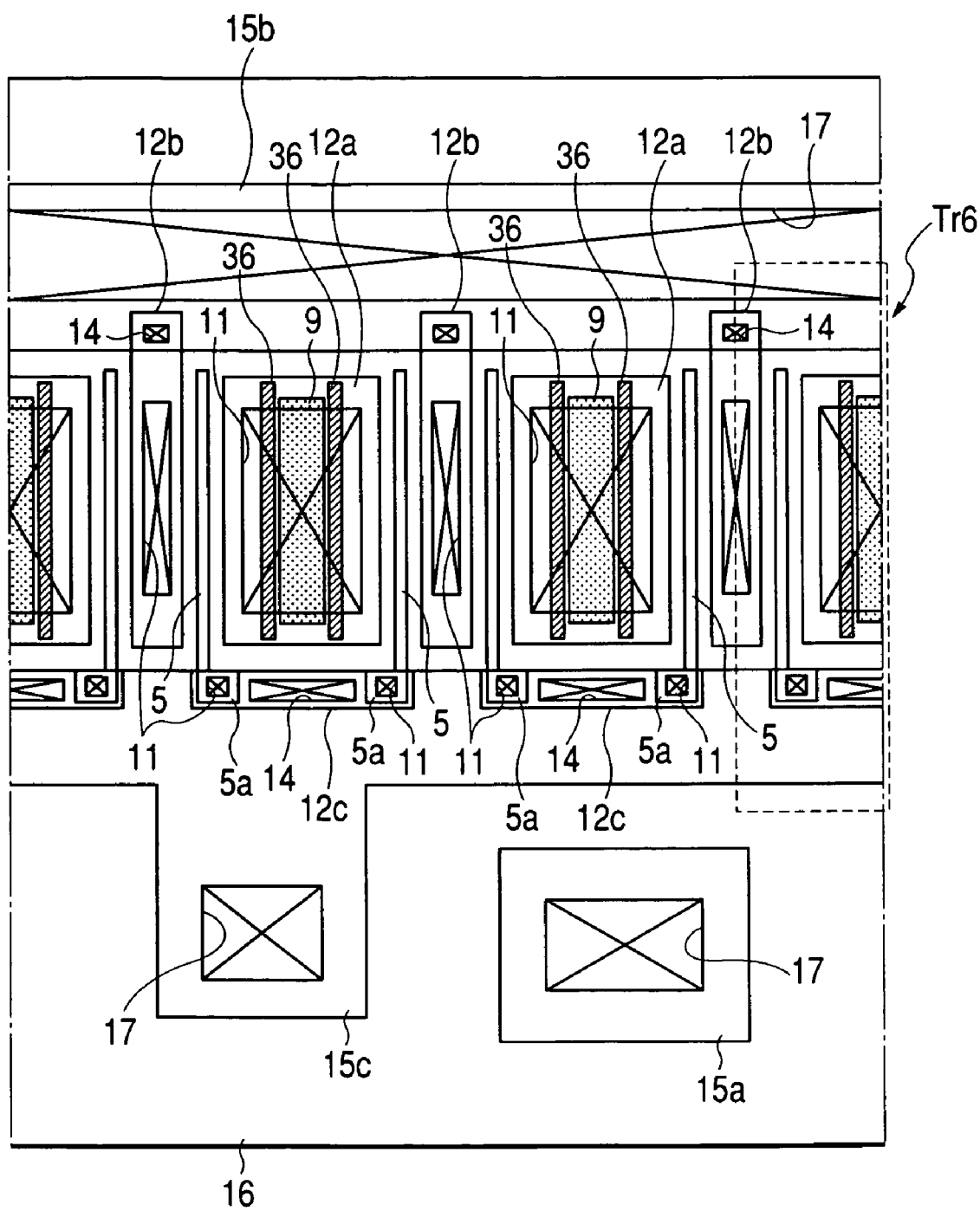
FIG. 23 is a partial layout diagram of a semiconductor substrate and illustrates a different example of the LDMOSes according to embodiment 2.

Other examples of the LDMOSes of the present embodiment 2 will be described with reference to FIGS. 21, 22 and 23, each of which is a partial layout view of a semiconductor substrate. FIGS. 21, 22 and 23 illustrate fourth LDMOSes Tr₄, fifth LDMOSes Tr₅ and sixth LDMOSes Tr₆, respectively.

In each of the fourth LDMOSes Tr₄ illustrated in FIG. 21, the same trench 36 for surrounding the p⁺ type source penetrating layer 9 as in the third LDMOS Tr₃ is provided in the second LDMOS Tr₂ of the above-mentioned embodiment 1.

In each of the fifth LDMOSes Tr₅ illustrated in FIG. 22, the same trench 36 for surrounding the p⁺ type source penetrating layer 9 as in the third LDMOS Tr₃ is formed, but an n⁺ type semiconductor region which constitutes a source is electrically connected, through a source electrode 42*a* made of a first layer interconnection, to the source electrode pad 15*a* formed on the front surface of the chip. That is, the following are made of a first interconnection: a source electrode 42*a* for connecting an n⁺ type semiconductor region, which constitutes the source, to the p⁺ type source penetrating layer 9; a drain electrode 42*b* connected to the n⁺ type semiconductor region, which constitutes a drain; and a gate connecting electrode 42*c* connected to the leading-out portion 5*a* of the gate electrode 5; and further a source electrode 42*a* is connected through a contact hole 43 to the source electrode pad 15*a* made of a second layer interconnection.

In each of the sixth LDMOSes Tr₆ illustrated in FIG. 23, the trenches 36 are made only in areas parallel to the n⁺ type semiconductor region, which constitutes the source, without surrounding the whole of the periphery of the p⁺ type source penetrating layer 9.

In the present embodiment 2, all of the source electrode pads 15*a* for probe inspection are formed on the front surface of the chip 1. However, without forming the source electrode pads 15*a*, the rear surface electrodes 18, formed on the rear surface of the silicon substrate 2*a*, may be used as electrodes for sources at the time of probe inspection. In this case, the reinforcing tape 28 used in the embodiment 1 cannot be adhered to the rear surface of the wafer 27; however, in the present embodiment 2, the impurity concentration in the p⁺ type source penetrating layer 9 can be made high to lower the inductance or the resistance of the source. Therefore, even if the thickness of the substrate is about 240 µm, a decrease in the high-frequency power gain can be prevented.

Figure 24:
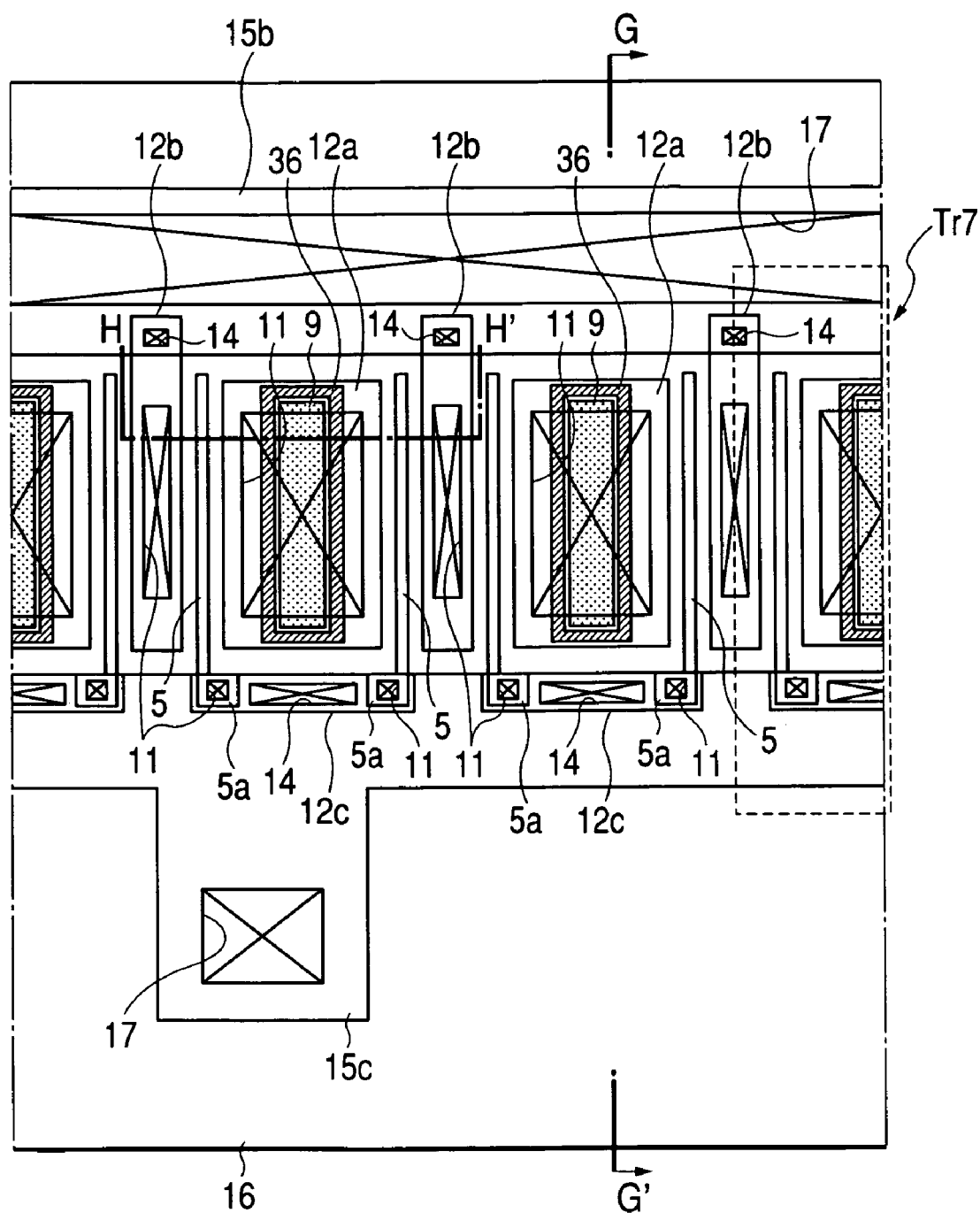
FIG. 24 is a partial layout diagram of a semiconductor substrate and illustrates an example of LDMOSes wherein a source electrode for probe inspection is made of a silicon substrate.
Figure 25:
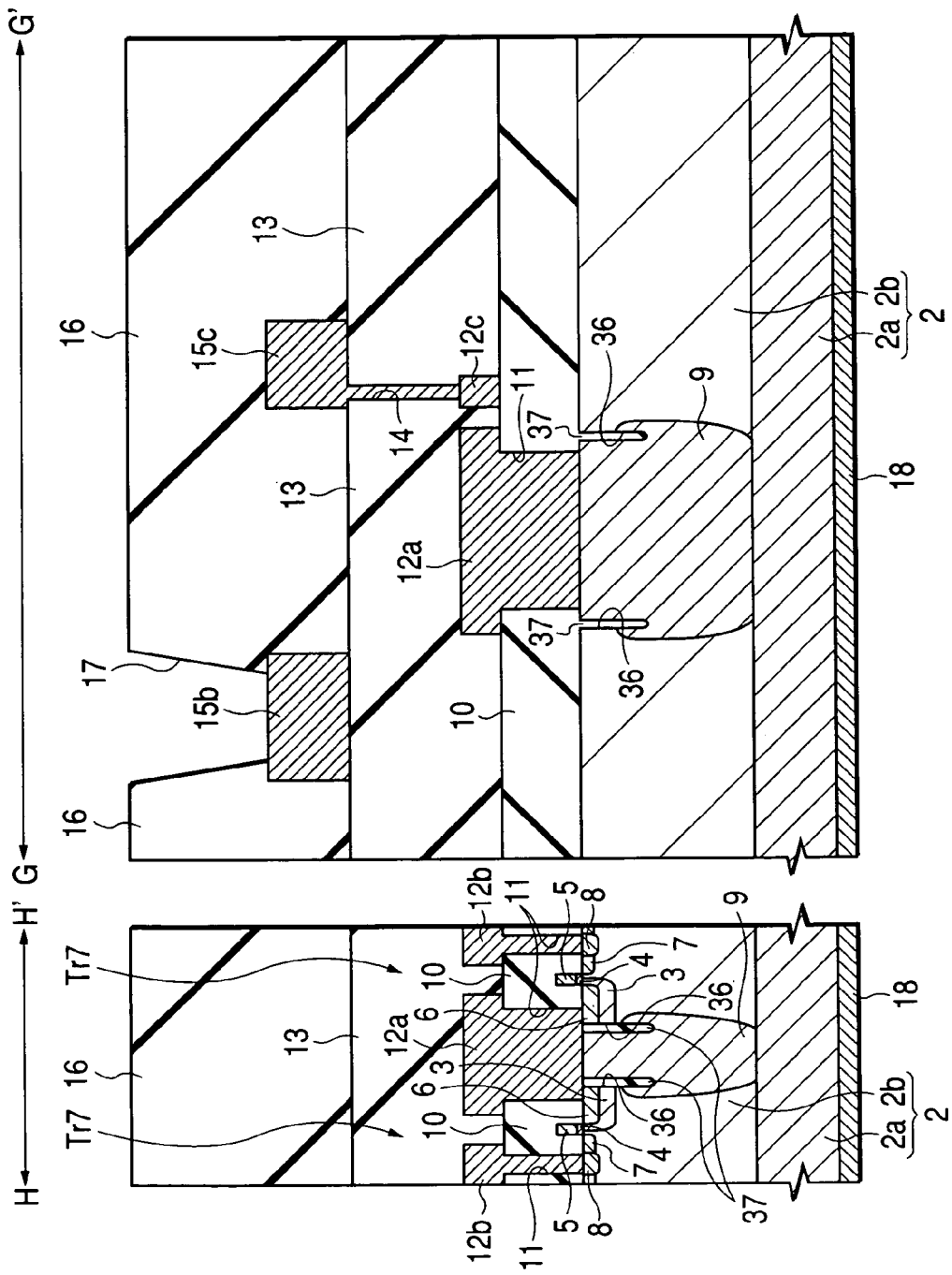
FIG. 25 is a partial sectional view of the semiconductor substrate, taken on line G–G' and line H–H' in FIG. 24.

FIG. 24 is a partial layout view of a semiconductor substrate, which represents an example of LDMOSes wherein rear electrodes are used as electrodes for sources at the time of probe inspection, and FIG. 25 is a partial sectional view of the semiconductor substrate, taken on line G–G' and line H–H' in FIG. 24.

The p⁺ type source penetrating layer 9 formed in each of the LDMOSes (i.e., the seventh LDMOSes) Tr7 reaches the silicon substrate 2 from the main face of the semiconductor layer 2*b*. In the same manner as in the third LDMOS Tr₃, the trench 36 having a thickness of 2 µm or more is formed between a region to which a p type impurity is diffused when the p⁺ type source penetrating layer 9 is formed and the channel region in such a manner that the trench 3 extends from the surface of the semiconductor layer 2*b* toward the silicon substrate 2*a*. However, in the seventh LDMOS Tr7, no source pad for probe inspection is formed on the front surface side of the chip 1. Therefore, the p⁺ type source penetrating layer 9*a*, the source leading-up electrode 12*d* and the source electrode pad 15*a*, which are formed in the third LDMOS Tr₃, are not formed.

As described above, according to the present embodiment 2, the p⁺ type source penetrating layer 9 can be prevented from spreading by forming the trench 36 between the region where a p type impurity is diffused, when the p⁺ type source penetrating layer 9 is formed, and the channel region of the LDMOS in such a manner that the trench 36 extends from the surface of the semiconductor layer 2*b* toward the silicon substrate 2*a*. This makes it possible to make the p⁺ type source penetrating layer 9 wide or make the impurity concentration in the p⁺ type source penetrating layer 9 high without increasing the cell pitch of the unit LDMOSes. Consequently, the inductance or the resistance of the source can be lowered and the high-frequency power gain can be improved. Furthermore, the shrinkage of the chip can be attained, since the cell pitch of the unit LDMOSes can be made small.

The present invention has been specifically described above on the basis of various embodiments thereof. Needless to say, however, the present invention is not limited to these embodiments, and is subjected to modification within any scope which does not depart from the concept of the present invention.

In the above-mentioned embodiments, cases in which the present invention is applied to n channel type LDMOSes have been described. However, the present invention can be applied to p channel type LDMOSes.

Advantageous effects produced by typical aspects or embodiments of the present invention are as follows.

Briefly, the characteristics of transistors, in particular, the high-frequency power gain thereof, can be improved, and the transistors and the chip containing the transistors can be made small.

What is claimed is:

1. A semiconductor device, comprising a laterally diffused field effect transistor including, over a semiconductor substrate, an element-forming area and a scribing area surrounding the element-forming area, the transistor including:
   (a) a semiconductor layer of a first conductive type formed in the element-forming area over the semiconductor substrate,
   (b) a gate insulating film formed over the semiconductor layer,
   (c) a gate electrode formed over the gate insulating film,
   (d) a source comprised of a first semiconductor region of a second conductive type which is different from the first conductive type,
   (e) a drain comprised of a second semiconductor region of the second conductive type having a first impurity concentration, and a third semiconductor region of the second conductive type having a higher second impurity concentration than the first impurity concentration and being formed at a position farther from the gate electrode than the second semiconductor region,
   (f) a fourth semiconductor region of the first conductive type where a channel region is formed,
   (g) an electrode electrically connected to the source and formed over the rear surface of the semiconductor substrate,
   (h) a source electrode pad, for evaluation, formed in the element-forming area over the front surface of the semiconductor substrate and being electrically connected to the semiconductor substrate,
   (i) a drain electrode pad formed over the front surface of the semiconductor substrate and being electrically connected to the third semiconductor region, and
   (k) a gate electrode pad electrically connected to the gate electrode.

2. The semiconductor device according to claim 1, wherein the source electrode pad for evaluation is not formed in the scribing area.

3. The semiconductor device according to claim 1, wherein the source electrode pad for evaluation and the semiconductor substrate are connected to each other through a fifth semiconductor region of the first conductive type formed in the semiconductor layer.

4. The semiconductor device according to claim 1, wherein a passivation film is formed over the semiconductor substrate and the thickness from the rear surface of the semiconductor substrate to the front surface of the passivation film covering the source electrode pad is 200 μm or less.

* * * * *